(12) United States Patent
Miller

(10) Patent No.: US 12,092,679 B1
(45) Date of Patent: Sep. 17, 2024

(54) PORTABLE SYSTEM FOR THE VALIDATION OF A SEMI-ANECHOIC CHAMBER

(71) Applicant: Phillip C. Miller, Tempe, AZ (US)

(72) Inventor: Phillip C. Miller, Tempe, AZ (US)

( * ) Notice: Subject to any disclaimer, the term of this patent is extended or adjusted under 35 U.S.C. 154(b) by 0 days.

(21) Appl. No.: 18/362,129

(22) Filed: Jul. 31, 2023

(51) Int. Cl.
*H01Q 1/12* (2006.01)
*G01R 29/08* (2006.01)
*G01R 29/10* (2006.01)
*H01Q 1/24* (2006.01)

(52) U.S. Cl.
CPC ....... *G01R 29/105* (2013.01); *G01R 29/0821* (2013.01)

(58) Field of Classification Search
CPC ... H01Q 1/08; H01Q 1/12; H01Q 1/24; G01R 29/10; G01R 29/105; G01R 29/08; G01R 29/0821
See application file for complete search history.

(56) References Cited

U.S. PATENT DOCUMENTS

| | | | | |
|---|---|---|---|---|
| 4,249,185 A * | 2/1981 | De Cesari | ............... | H01Q 7/02 343/871 |
| 5,646,635 A * | 7/1997 | Cockson | ............. | H01Q 1/2275 343/702 |
| 8,786,511 B1 * | 7/2014 | Dao | ....................... | H01Q 21/26 343/793 |
| 8,902,121 B1 * | 12/2014 | Locker | ..................... | H01Q 1/08 248/156 |
| 9,634,382 B2 * | 4/2017 | Pryor | ..................... | H01Q 21/26 |
| 11,567,115 B1 * | 1/2023 | Miller | .................. | G01R 29/105 |

* cited by examiner

*Primary Examiner* — Tho G Phan
(74) *Attorney, Agent, or Firm* — Booth Udall Fuller, PLC; Pacer K. Udall

(57) ABSTRACT

A portable system for the validation of a semi-anechoic chamber includes an antenna including a radiative element having a measurement point. Also included is a transmit mast having a deployed configuration and a stowed configuration, the transmit mast including a base, a vertical support, and an antenna mount configured to hold the antenna in a vertical arrangement and a horizontal arrangement while the transmit mast is in the deployed configuration, with the vertical arrangement of the antenna including the radiative element being oriented to have a vertical polarity, and with the horizontal arrangement of the antenna including the radiative element being oriented to have a horizontal polarity. The portable system has a deployed configuration and a stowed configuration. The portable system may be sized such that when the transmit mast is in the stowed configuration, the portable system fits inside a carry-on luggage.

19 Claims, 16 Drawing Sheets

US 12,092,679 B1

PORTABLE SYSTEM FOR THE VALIDATION OF A SEMI-ANECHOIC CHAMBER

TECHNICAL FIELD

Aspects of this document relate generally to the validation of semi-anechoic chambers.

BACKGROUND

All electrical devices in the world must be approved by the government of the country in which they operate. Laws have established requirements for testing to regulatory standards, such as those of the FCC (US) or CE (European Union). Test equipment used for this testing must be traceable and shown to meet international reference standards. Additionally, all testing must be accredited by an independent agency. These tests are typically done at a unique test stations using specialized test equipment.

The most utilized test station in a lab, and where most regulatory failures happen, is Radiated Emissions. This test is typically done in a semi-anechoic chamber (SAC) or Open Area Test Site (OATS). A semi-anechoic chamber is a large metal box, typically 5-15 m long and 5 m tall. The interior walls and ceiling are covered in absorbers made of foam or other materials. Within the SAC, electrical signals are absorbed by the walls rather than bouncing off of them. The purpose of this chamber is to simulate a perfect ground surface with an infinite volume in 3 dimensions. On one end of the chamber is a large turntable (0.5-6 m diameter) for rotating the "equipment under test" (EUT). On the opposite end is an antenna on a mast for measuring the electrical noise emitting from the EUT. The turntable rotates, allowing the EUT to be measured from all directions. An OATS functions in the same manner as a SAC, but is positioned far enough away from interference and reflections to operate without a metal shield or absorber material. However, the method for validating its performance is the same.

In order for test results from a SAC/OATS to be used for the regulatory certification of devices, the SAC/OATS must be validated or characterized to meet a standard. For example, one type of validation must show that the environment within the SAC/OATS sufficiently approximates that perfect ground plane beneath an infinite three-dimensional volume. Traditionally, this validation is performed using a transmitter and a receiver, each mounted on masts. The transmit mast is placed at different positions within the volume or "quiet zone" being validated, a volume that is typically centered on the turntable. At each of those positions, a standing wave inside the chamber is examined. For example, the transmit mast may be placed at the four cardinal points of the turntable, and the center. The transmit mast may also be placed at different heights. The receive mast is moved so it is always separated from the transmit mast by the same distance (e.g., 3 m, etc.). For each point, a signal is sent between the masts, and then they are moved slightly to examine the standing wave (e.g., 6 points at each location to validate at 18 GHz, etc.). The SAC/OATS is validated if the differences in signal strength at the different points do not exceed a limit (i.e., a regulatory limit).

The traditional methods for validation are problematic for a number of reasons. Validation of an SAC/OATS is expensive. Unlike most pieces of test equipment, the SAC/OATS cannot be packaged and shipped back to the manufacturer for annual calibration and correction. Instead, on an annual basis, a characterization of the chamber is accomplished by accredited professionals over several days. In many cases, the cost of the validation is increased due to the expenses related to travel and housing for those accredited professionals for days or weeks at a time. This is in addition to the expense of shipping the specialized test equipment needed for the validation. It is not uncommon for shipping to result in costly delays and damaged equipment, even when accompanying the accredited professional in the cargo hold of their flight.

The procedure itself is time consuming. The masts are moved manually to their various positions. Each measurement point performed within the quiet zone requires the technician to unseal the door, enter the chamber, move the transmit mast, move the receive mast, measure the separation between the masts and adjust to ensure the separation stays the same, leave and seal the chamber, and take a reading. This is a time consuming process that gets repeated for each position, height, and polarity. As a specific example, five locations at two heights tor both polarities, taken at six linear alterations to probe an 18 GHz standing wave means the technician is repeating this process 120 times. Each measurement can take up to five minutes, which adds up to many hours. This tedious process also provides many opportunities for error. The distance measurements are typically performed manually using tape measures, to reduce the amount of reflective materials within the chamber. The validation of a single SAC/OATS can cost tens of thousands of dollars, or more.

The semi-anechoic chamber is usually the largest, most costly, and most utilized test station in a lab. These chambers can cost millions of dollars; any downtime for validation is time the chamber is not earning and recouping that large cost. Additionally, a failed validation can call into question all of the test results produced by that chamber since its last validation. Because conventional methods are so expensive and slow, the time between validations can be long (e.g., annual validation), risking a large number of test results and additional lost revenue.

SUMMARY

According to one aspect, a portable system for the validation of a semi-anechoic chamber, includes an antenna having a handle, a housing, and a radiative element having a measurement point, with the radiative element positioned inside the housing and the handle extending away from the housing. The antenna is configured to communicatively couple with a cable through the handle. The portable system also includes a transmit mast having a deployed configuration and a stowed configuration. The transmit mast includes a base includes a plurality of sampling locations along a first direction, a sliding mount, a horizontal crossbar, and a vertical support that is hollow and includes a first segment, a second segment, and a longitudinal opening sized to admit the handle. The transmit mast also includes an end cap that tapers to a tip, a vibration dampening material coupled to one of the vertical support and the end cap, and an antenna mount. The antenna mount includes an indentation that is concave and a first antenna connector that is an aperture passing through the indentation, the first antenna connector configured to receive the handle of the antenna and hold the antenna in a vertical arrangement while the transmit mast is in the deployed configuration, with the vertical arrangement of the antenna having the radiative element being oriented to have a vertical polarity. The antenna mount also includes a second antenna connector that is a notch, the second antenna connector configured to receive the handle of the antenna and hold the antenna in a horizontal arrangement while the transmit mast is in the deployed configuration, with the horizontal arrangement of the antenna having the radiative element being oriented to have a horizontal polarity. Both the first antenna connector and the second antenna connector each have a void, each void sized to admit the handle of the antenna such that the cable can remain coupled to the handle of the antenna as the antenna is moved between the vertical arrangement and the horizontal arrangement while the transmit mast is in the deployed configuration. The deployed configuration includes the sliding mount slidably coupled to the base such that the sliding mount is slidable along a first direction, the sliding mount configured to slide between all sampling locations and also configured to releasably couple to the base at any of the sampling locations the deployed configuration also includes the horizontal crossbar slidably coupled to the sliding mount such that the horizontal crossbar is slidable in a second direction that is substantially perpendicular to the first direction the deployed configuration further includes the first segment of the vertical support releasably coupled to the second segment of the vertical support, the vertical support releasably coupled to the horizontal crossbar, and the antenna mount coupled to the first segment of the vertical support, opposite the second segment of the vertical support, with the antenna mount oriented with respect to the vertical support such that the void of the first antenna connector is aligned with the longitudinal opening of the vertical support. The deployed configuration also includes the end cap coupled to the vertical support opposite the antenna mount, with the vibration dampening material between the end cap and the vertical support, and the antenna mount holding the antenna in one of the vertical arrangement and the horizontal arrangement while the antenna is communicatively coupled to the cable. The stowed configuration includes the vertical support released from the horizontal crossbar, the first segment released from the second segment, and the horizontal crossbar, first segment, and second segment all being substantially parallel with the base and with each other. The antenna mount is further configured to hold the antenna such that the measurement point of the radiative element is at the same location relative to the transmit mast and directly above the tip of the end cap for both the vertical arrangement and the horizontal arrangement of the antenna. The housing of the antenna and the indentation of the antenna mount are each shaped such that the antenna settles into the vertical arrangement when the handle of the antenna is inside the aperture of the antenna mount and inside the vertical support while the housing sits in the indentation, and such that the antenna settles into the horizontal arrangement when the handle is placed in the notch of the antenna mount while the housing sits in the indentation. The portable system is sized such that when the transmit mast is in the stowed configuration, the portable system fits inside a carry-on luggage.

Particular embodiments may comprise one or more of the following features. The sampling locations may be holes. The sliding mount may be configured to releasably couple to any sampling location through a fastener. Further include a vector network analyzer. The deployed configuration of the transmit mast may include the antenna mount holding the antenna in one of the vertical arrangement and the horizontal arrangement while the antenna is communicatively coupled to the vector network analyzer through the cable. The carry-on luggage may measure no more than 22 inches by 14 inches by 9 inches. The transmit mast may be RF transparent up to 40 GHz. The transmit mast may be composed of a thermoplastic.

According to another aspect of the disclosure, a portable system for the validation of a semi-anechoic chamber, includes an antenna having a radiative element having a measurement point, and a transmit mast having a deployed configuration and a stowed configuration. The transmit mast includes a base, a vertical support, and an antenna mount configured to hold the antenna in a vertical arrangement and a horizontal arrangement while the transmit mast is in the deployed configuration, with the vertical arrangement of the antenna having the radiative element being oriented to have a vertical polarity, and with the horizontal arrangement of the antenna having the radiative element being oriented to have a horizontal polarity. The deployed configuration includes the vertical support releasably coupled to the base, the antenna mount coupled to the vertical support, opposite the base, and the antenna mount holding the antenna in one of the vertical arrangement and the horizontal arrangement while the antenna is communicatively coupled to a cable. The stowed configuration includes the vertical support being substantially parallel with the base. The antenna mount is further configured to hold the antenna such that the measurement point of the radiative element is at the same location relative to the transmit mast for both the vertical arrangement and the horizontal arrangement of the antenna. The portable system is sized such that when the transmit mast is in the stowed configuration, the portable system fits inside a carry-on luggage.

Particular embodiments may comprise one or more of the following features. The antenna mount may include a first antenna connector configured to receive the antenna and hold the antenna in the vertical arrangement, and a second antenna connector configured to receive the antenna and hold the antenna in the horizontal arrangement. The antenna may include a handle and a housing, with the radiative element positioned inside the housing and the handle extending away from the housing. The antenna may be configured to communicatively couple with the cable through the handle. The first antenna connector and the second antenna connector may be each configured to receive the handle of the antenna. The vertical support may be hollow and/or may include a longitudinal opening sized to admit the handle. Both the first antenna connector and the second antenna connector each may include a void. The deployed configuration may include the antenna mount being oriented with respect to the vertical support such that the void of the first antenna connector is aligned with the longitudinal opening of the vertical support. Each void may be sized to admit the handle of the antenna such that the cable can remain coupled to the handle of the antenna as the antenna is moved between the vertical arrangement and the horizontal arrangement while the transmit mast is in the deployed configuration. The antenna mount may include an indentation that is concave. The first antenna connector of the antenna mount may be an aperture passing through the indentation and the second antenna connector of the antenna mount may be a notch. The notch and aperture both may be sized to receive the handle of the antenna. The housing of the antenna and the indentation of the antenna mount may be each shaped such that the antenna settles into the vertical arrangement when the handle of the antenna is inside the aperture of the antenna mount and inside the vertical support while the housing sits in the indentation. The antenna may settle into the horizontal arrangement when the handle is placed in the notch of the antenna mount while the housing sits in the indentation. The transmit mast may include a sliding mount. The deployed configuration of the transmit mast may include the sliding mount slidably coupled to the base such that the sliding mount is slidable along a first direction. The base may include a plurality of predefined sampling locations along the first direction. The sliding mount may be configured to slide between all sampling locations and may also be configured to releasably couple to the base at any of the sampling locations. The sampling locations may be holes. The sliding mount may be configured to releasably couple to any sampling location through a fastener. The transmit mast may include a horizontal crossbar. The deployed configuration may include the horizontal crossbar slidably coupled to the sliding mount such that the horizontal crossbar may be slidable in a second direction that may be substantially perpendicular to the first direction. The deployed configuration may include vertical support releasably coupled to the horizontal crossbar. The stowed configuration may include the horizontal crossbar and the vertical support being substantially parallel with the base and with each other. The transmit mast may further include an end cap that tapers to a tip. The transmit mast may further include a vibration dampening material coupled to one of the vertical support and the end cap. The deployed configuration may include the end cap coupled to the vertical support opposite the antenna mount, with the vibration dampening material between the end cap and the vertical support. For both the vertical arrangement and the horizontal arrangement of the antenna, the measurement point of the radiative element may be directly above the tip of the end cap. The vertical support may include a first segment and a second segment. The deployed configuration may include the first segment of the vertical support releasably coupled to the second segment of the vertical support. The deployed configuration may include the second segment of the vertical support being releasably coupled to the base. The antenna mount may be coupled to the first segment of vertical support, opposite the second segment. The stowed configuration may include the horizontal crossbar, the first segment, and the second segment all being substantially parallel with the base and with each other. The system may further include a vector network analyzer. The deployed configuration of the transmit mast may include the antenna mount holding the antenna in one of the vertical arrangement and the horizontal arrangement while the antenna is communicatively coupled to the vector network analyzer through the cable. The carry-on luggage may measure no more than 22 inches by 14 inches by 9 inches. The transmit mast may be RF transparent up to 40 GHz. The transmit mast may be composed of a thermoplastic.

Aspects and applications of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

The disclosure will hereinafter be described in conjunction with the appended drawings, where like designations denote like elements, and.

DETAILED DESCRIPTION

Figure 1A:
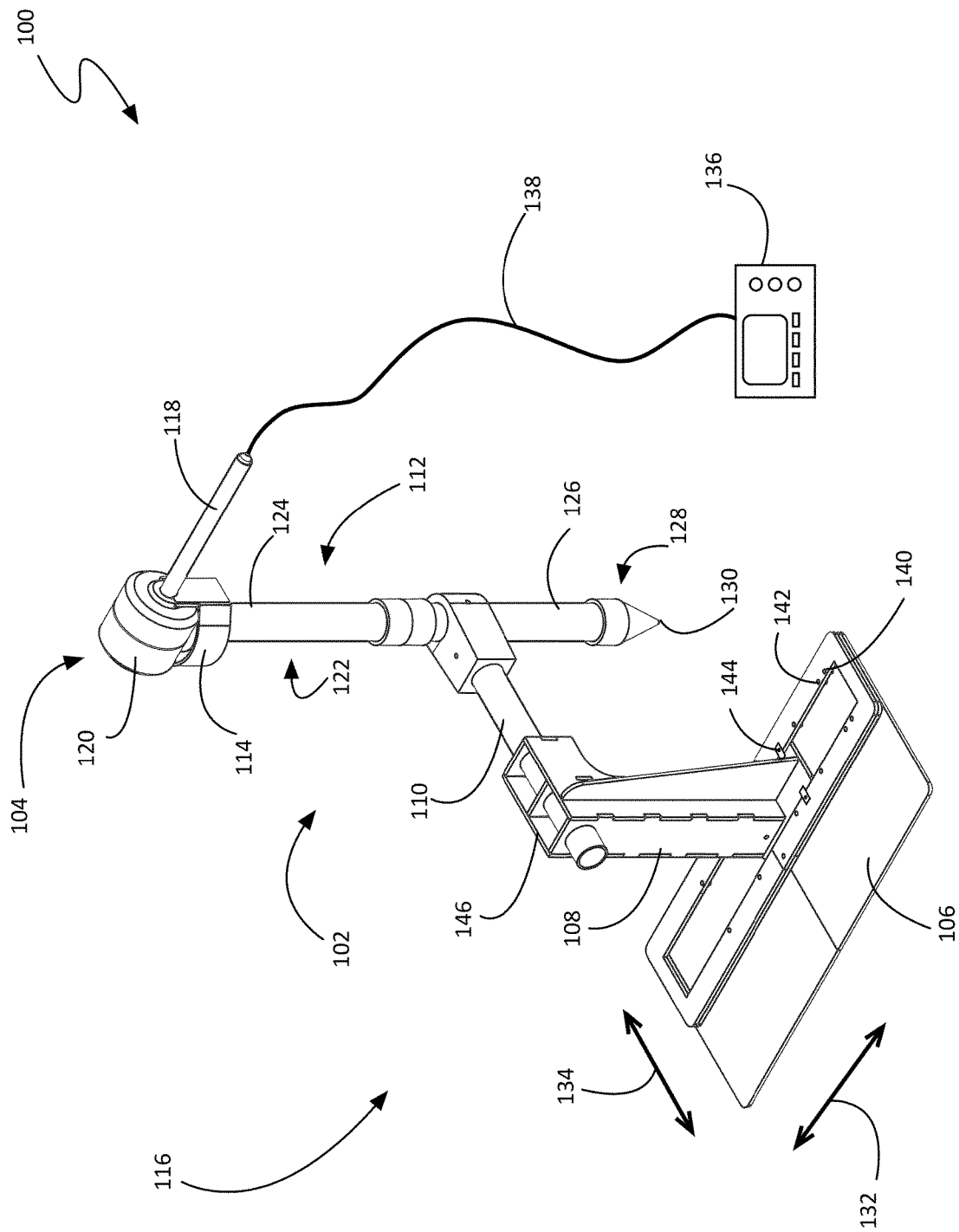
FIGS. 1A-1D are perspective, side, back, and top views of a portable validation system, respectively.
Figure 1B:
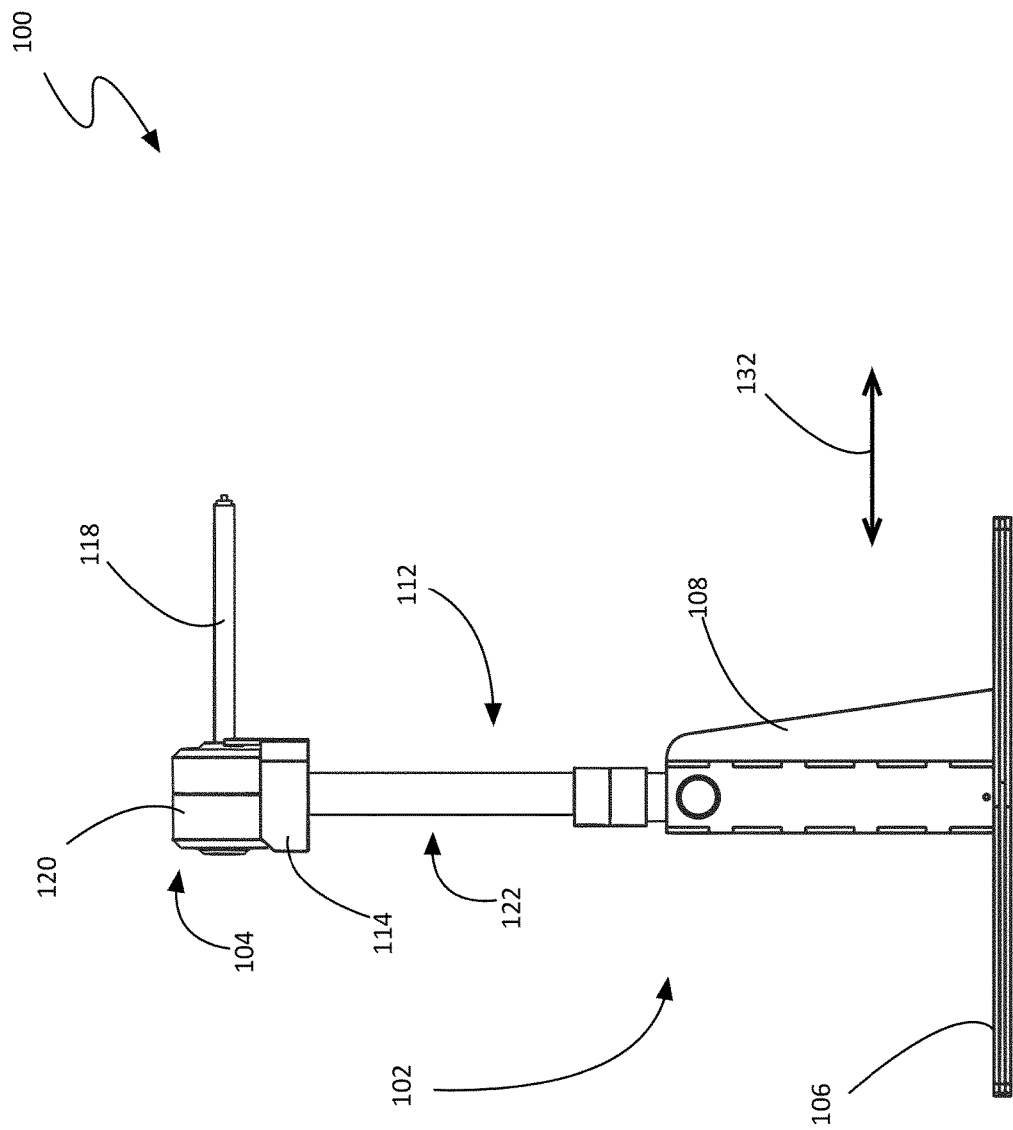
Figure 1C:
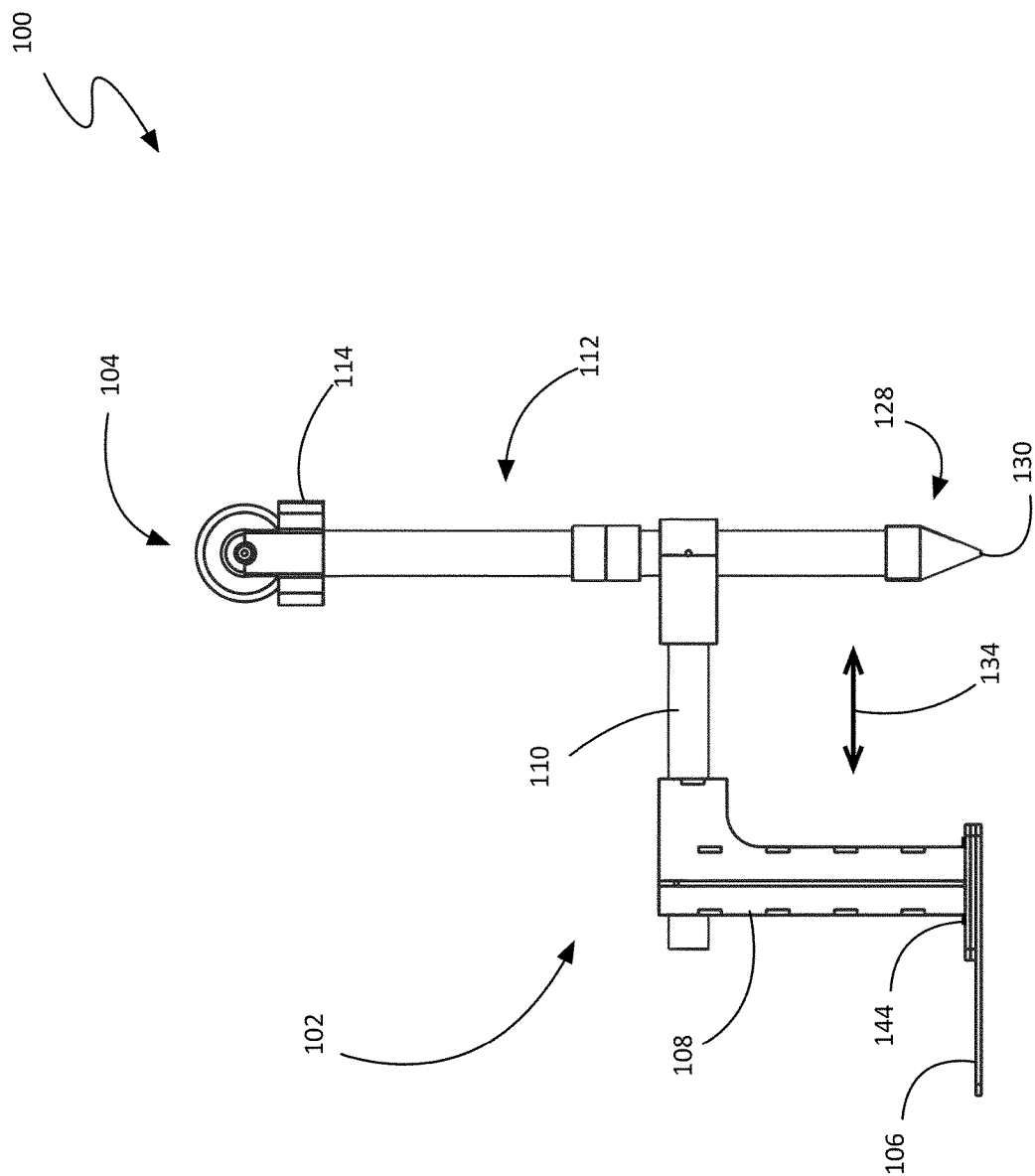
Figure 1D:
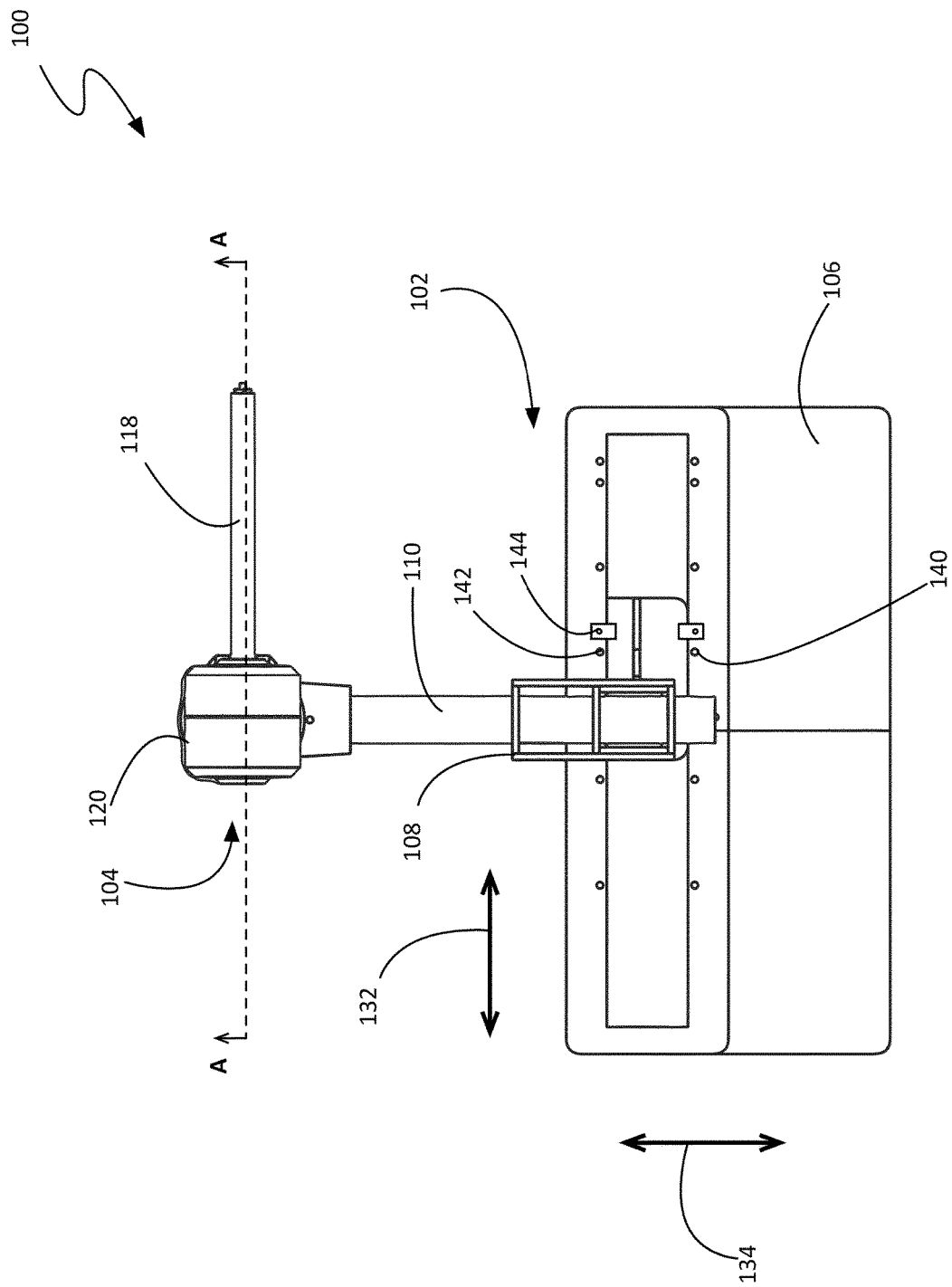

This disclosure, its aspects and implementations, are not limited to the specific material types, components, methods, or other examples disclosed herein. Many additional material types, components, methods, and procedures known in the art are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

While this disclosure includes a number of embodiments in many different forms, there is shown in the drawings and will herein be described in detail particular embodiments with the understanding that the present disclosure is to be considered as an exemplification of the principles of the disclosed methods and systems, and is not intended to limit the broad aspect of the disclosed concepts to the embodiments illustrated.

All electrical devices in the world must be approved by the government of the country in which they operate. Laws have established requirements for testing to regulatory standards, such as those of the FCC (US) or CE (European Union). Test equipment used for this testing must be traceable and shown to meet international reference standards. Additionally, all testing must be accredited by an independent agency. These tests are typically done at a unique test stations using specialized test equipment.

The most utilized test station in a lab, and where most regulatory failures happen, is the semi-anechoic chamber (SAC/OATS). A semi-anechoic chamber is a large metal box, typically 5-15 m long and 5 m tall. The interior walls and ceiling are covered in absorbers made of foam or other materials. Within the SAC/OATS, electrical signals are absorbed by the walls rather than bouncing off of them. The purpose of this chamber is to simulate a perfect ground surface with an infinite volume in 3 dimensions. On one end of the chamber is a large turntable (0.5-6 m diameter) for rotating the "equipment under test" (EUT). On the opposite end is an antenna on a mast for measuring the electrical noise emitting from the EUT. The turntable rotates, allowing the EUT to be measured from all directions.

In order for test results from a SAC/OATS to be used for the regulatory certification of devices, the SAC/OATS must be validated or characterized to meet a standard. For example, one type of validation must show that the environment within the SAC/OATS sufficiently approximates that perfect ground plane beneath an infinite three-dimensional volume. Traditionally, this validation is performed using a transmitter and a receiver, each mounted on masts. The transmit mast is placed at different positions within the volume or "quiet zone" being validated, a volume that is typically centered on the turntable. At each of those positions, a standing wave inside the chamber is examined. For example, the transmit mast may be placed at the four cardinal points of the turntable, and the center. The transmit mast may also be placed at different heights. The receive mast is moved so it is always separated from the transmit mast by the same distance (e.g., 3 m, etc.). For each point, a signal is sent between the masts, and then they are moved slightly to examine the standing wave (e.g., 6 points at each location to validate at 18 GHz, etc.). The SAC/OATS is validated if the differences in signal strength at the different points do not exceed a limit (i.e., a regulatory limit).

The traditional methods for validation are problematic for a number of reasons. Validation of an SAC/OATS is expensive. Unlike most pieces of test equipment, the SAC/OATS cannot be packaged and shipped back to the manufacturer for annual calibration and correction. Instead, on an annual basis, a characterization of the chamber is accomplished by accredited professionals over several days. In many cases, the cost of the validation is increased due to the expenses related to travel and housing for those accredited professionals for days or weeks at a time. This is in addition to the expense of shipping the specialized test equipment needed for the validation. It is not uncommon for shipping to result in costly delays and damaged equipment, even when accompanying the accredited professional in the cargo hold of their flight.

The procedure itself is time consuming. The masts are moved manually to their various positions. Each measurement point performed within the quiet zone requires the technician to unseal the door, enter the chamber, move the transmit mast, move the receive mast, measure the separation between the masts and adjust to ensure the separation stays the same, leave and seal the chamber, and take a reading. This is a time consuming process that gets repeated for each position, height, and polarity. As a specific example, five locations at two heights tor both polarities, taken at six linear alterations to probe an 18 GHz standing wave means the technician is repeating this process 120 times. Each measurement can take up to five minutes, which adds up to many hours. This tedious process also provides many opportunities for error. The distance measurements are typically performed manually using tape measures, to reduce the amount of reflective materials within the chamber. The validation of a single SAC/OATS can cost tens of thousands of dollars, or more.

The semi-anechoic chamber is usually the largest, most costly, and most utilized test station in a lab. These chambers can cost millions of dollars; any downtime for validation is time the chamber is not earning and recouping that large cost. Additionally, a failed validation can call into question all of the test results produced by that chamber since its last validation. Because conventional methods are so expensive and slow, the time between validations can be long (e.g., annual validation), risking a large number of test results and additional lost revenue.

Contemplated herein is a portable system for the validation of a semi-anechoic chamber (SAC/OATS). According to various embodiments, the contemplated system includes a transmit mast that is modular, made up of various components that can easily be broken down and stowed in a container small enough to be taken on an airplane as a carry-on bag. The traditional approach of shipping the required test equipment required lead time; sometimes a validation would have to be booked weeks in advance in order for the equipment to arrive. The contemplated portable system makes it possible to deploy a testing professional and their test equipment overnight, only requiring enough time to buy a plane ticket and grab a backpack containing everything needed for the validation. Being able to travel with the contemplated system as a carry-on (and thus, never needing to be out of the professional's possession) significantly reduces the chances the equipment will be lost or damaged while in transit.

Additionally, the contemplated system provides a number of additional advantages over conventional systems that can make the testing easier to perform with greater accuracy and consistency but requiring less time. According to some embodiments, the contemplated system allows the polarity of the antenna to be changed without having to make any other adjustments. This is because a novel antenna mount maintains the location of the antenna's measurement point, allowing a change between vertical and horizontal polarities without requiring any other adjustments such as mast height.

In conventional testing systems, one must estimate whether the measurement point is at the edge of the quiet zone being characterized. In some embodiments, the transmit mast includes an end cap that is in contact with the floor and whose tip indicates the exact location of the measurement point. This allows the validator to ensure that they are taking measurements right at the edge of the quiet zone (e.g., edge of turntable, etc.).

The validation of a semi-anechoic chamber typically involves taking a large number of measurements. Inconsistencies in hardware setup between measurements are easy to cause. Advantageous over conventional systems, the contemplated portable system facilitates making consistent, accurate measurements through features including being shaped to hold the measurement point constant in both polarities, as well as self-locating or self-positioning of the antenna in the antenna mount, according to various embodiments. This makes it easy to get the same results every time, independent of who is performing the test.

Additionally, in some embodiments the contemplated portable system is made using materials that are RF transparent at frequencies that are mostly beyond the reach of traditional masts. Furthermore, the contemplated system is designed for use in validation through taking measurements in the time domain, rather than the frequency domain measurements taken in conventional validation methods. Not only do these measurements lead to a more accurate characterization of the quiet zone, but they are also easier and quicker to perform, relying on the turntable to move the transmit mast rather than doing so by hand.

FIGS. 1A-1D are perspective, side, back, and top views of a non-limiting example of a portable validation system 100, respectively. According to various embodiments, the contemplated portable semi-anechoic chamber validation system (hereinafter "portable validation system 100" or simply "portable system 100") comprises a transmit mast 102 made up of a base 106 and an antenna mount 114 attached to the top of a vertical support 112, as well as an antenna 104, according to various embodiments. In some embodiments, the transmit mast 102 of the portable system 100 may include additional structure such as a sliding mount 108 and a horizontal crossbar 110, and the system 100 itself may include additional components such as a vector network analyzer 136 and a cable 138, as shown in FIGS. 1A-1D. Each of these components will be discussed, below.

It should be noted that while the contemplated system may be used for the validation of both SAC and OATS sites, the bulk of the following discussion will be in the context of a SAC. However, this should not be interpreted as limiting the application to SAC. In the context of the present description and the claims that follow, any reference to a semi-anechoic chamber can also be applied to an OATS site, or similar installation having similar validation requirements, and serving similar functions.

The non-limiting example of a transmit mast 102 in FIGS. 1A-1D is shown in a deployed configuration 116. According to various embodiments, the transmit mast 102 can move between a deployed configuration 116 and a stowed configuration 200. The stowed configuration 200 will be discussed in the context of FIGS. 2A-2F, below. In the context of the present description and the claims that follow, the deployed configuration 116 of the transmit mast 102 is a configuration where the transmit mast 102 is ready for use. For each of the components of various embodiments of the transmit mast 102 discussed below, that component's role or roles in the deployed configuration 116 will be explored.

The portable system 100 contemplated herein comprises an antenna 104. In some embodiments, the antenna 104 may comprise a housing 120 that protects radiative elements, and a handle 118 that extends away from the housing 120. The housing 120 may be a shell or solid, similar to a radome. According to various embodiments, the housing 120 is RF transparent in applicable frequencies. Typically, such a housing 120 would mainly serve to protect the radiative elements of the antenna 104. However, in some embodiments, the shape of the housing 120 and the shape of the antenna mount 114 can be used to provide another advantage over conventional testing systems, as will be discussed further in the context of FIG. 3, below.

According to various embodiments, the antenna 104 is configured to communicatively couple with a cable 138 (e.g., an RF coaxial cable, etc.). In some embodiments where the antenna 104 has a handle 118, the antenna 104 may be able to couple with a cable 138 through the handle 118. The handle 118 may also be used for mounting the antenna 104, as is known in the art.

The antenna 104 is held in place by the antenna mount 114. In the context of the present description and the claims that follow, an antenna mount 114 is a structure configured to hold the antenna 104 at a particular point in space with a particular orientation. In some embodiments, the antenna 104 may be temporarily locked in place to the antenna mount 114, while in others the antenna 104 may simply be sitting on the antenna mount 114, only constrained by the pull of gravity and the shape of the antenna mount 114.

When the transmit mast 102 is in the deployed configuration 116, the antenna mount 114 is coupled to the upper end of a vertical support 112. In some embodiments, the deployed configuration 116 of the transmit mast 102 also includes the antenna mount 114 holding the antenna 104 such that it has horizontal polarity of vertical polarity while the antenna 104 is also communicatively coupled to a cable 138.

In the deployed configuration 116, the antenna mount 114 is coupled to the vertical support 112, according to various embodiments. In some embodiments, the antenna mount 114 is releasably coupled to the vertical support 112, while in other embodiments it is fixedly coupled. In some embodiments, the vertical support 112 is hollow, while in other embodiments, the vertical support 112 may be solid.

In some embodiments, the vertical support 112 is a single, integral piece. In other embodiments, including the non-limiting example shown in FIGS. 1A-1D, the vertical support 112 may be segmented. The main purpose of the vertical support 112 is to hold the antenna mount 114 (and the antenna 104) at the desired height during the validation. As different heights may be needed for a test, some embodiments of the portable system 100 include vertical supports 112 of various lengths. The use of a segmented vertical support 112 may be advantageous, as it reduces the total bulk of the system 100 while still providing a way to have multiple antenna height options.

In some embodiments, a segmented vertical support 112 may have two segments, a first segment 124 (i.e., the top or upper segment) that couples with the antenna mount 114, and a second segment 126, opposite the antenna mount 114. In other embodiments, a segmented vertical support 112 may have more segments. In some embodiments, segments of the vertical support 112 may couple directly to each other. In other embodiments, neighboring segments may be coupled together using a sleeve, an adapter, or some other structure that bridges the gap between the two segments by coupling with each of them. See, for example, the sleeve that is bolted on to both segments in FIG. 1A.

One advantage the contemplated portable system 100 can provide over conventional testing systems is greater efficiency through streamlined procedures. For example, according to various embodiments, while the transmit mast 102 is in the deployed configuration 116, the antenna 104 may be moved back and forth between horizontal and vertical polarities without having to change any connections. Specifically, in some embodiments, the antenna 104 may move between the two polarities while remaining communicatively coupled to a vector network analyzer 136 or some other device through a cable 138. This places some constraints on the nature of the interaction between the antenna 104 and the antenna mount 114.

Notwithstanding the constraints such ease of transition places on the geometry of the antenna mount 114, which will be discussed within the context of FIG. 3, in some embodiments the vertical support 112 may also play a role. As previously mentioned, in some embodiments the measurement point of the antenna 104 is maintained directly above the tip 130 of the end cap 128 that is coupled to the vertical support 112 opposite the antenna mount 114. In the embodiments where the end cap 128 tapers symmetrically, the tip 130 will be centered on the end cap 128 and on the vertical support 112. According to various embodiments where the antenna 104 comprises a handle 118, the measurement point is aligned with the handle 118. This means for one of the polarities, the handle 118 will be aligned with the vertical support 112. In some of these embodiments, the vertical support 112 is hollow, and comprises a longitudinal opening 122 sized to admit the handle 118. Without this longitudinal opening 122, the antenna 104 would not be movable into a polarity where the handle 118 is pointed down toward the end cap 128 without first disconnecting the cable 138, slowing down the process of changing polarity during validation and introducing more opportunity for introducing error. The longitudinal opening 122 allows the cable 138 to drop straight down and run along the inside of at least part of the length of the vertical support 112.

In some embodiments, the longitudinal opening 122 may only extend down the vertical support 112 far enough to allow the handle 118 (and attached cable 138) to enter into the hollow interior. In other embodiments, the longitudinal opening 122 may run the length of the vertical support 112. In some embodiments having a segmented vertical support 112, the longitudinal opening 122 may be confined to the first segment 124 (i.e., the upper segment coupled to the antenna mount 114), extending along some or all of the first segment 124. In other embodiments, multiple segments may have longitudinal openings 122.

In other embodiments where the vertical support 112, or one or more segments of the vertical support 112, has a longitudinal opening 122, the vertical support 112 may need to be strengthened from the inside to prevent deformation of its shape. For example, as shown in FIG. 1A, the vertical support 112 or a segment may be fortified with a plurality of ribs spaced along the length of the interior. In other embodiments, other spacings, distributions, and/or structures may be employed to fortify the vertical support 112 also having a longitudinal opening 122.

In the context of the present description and the claims that follow, the base 106 is a flat, thin component that serves as the foundation of the transmit mast 102. The deployed configuration 116 of the transmit mast 102 comprises the vertical support 112 releasably coupled to the base 106. In some embodiments, the vertical support 112 is directly coupled to the base 106, while in other embodiments the vertical support 112 may be coupled to the base 106 through the sliding mount 108, and in still other embodiments through the horizontal crossbar 110 and the sliding mount 108.

The sliding mount 108 is a component of the transmit mast 102. According to various embodiments, the deployed configuration 116 further comprises the sliding mount 108 slidably coupled to the base 106 such that the sliding mount 108 is slidable along a first direction 132. In the context of FIGS. 1A-1D, the first direction 132 runs between front and back, as seen in the side view of FIG. 1B.

Figure 6A:
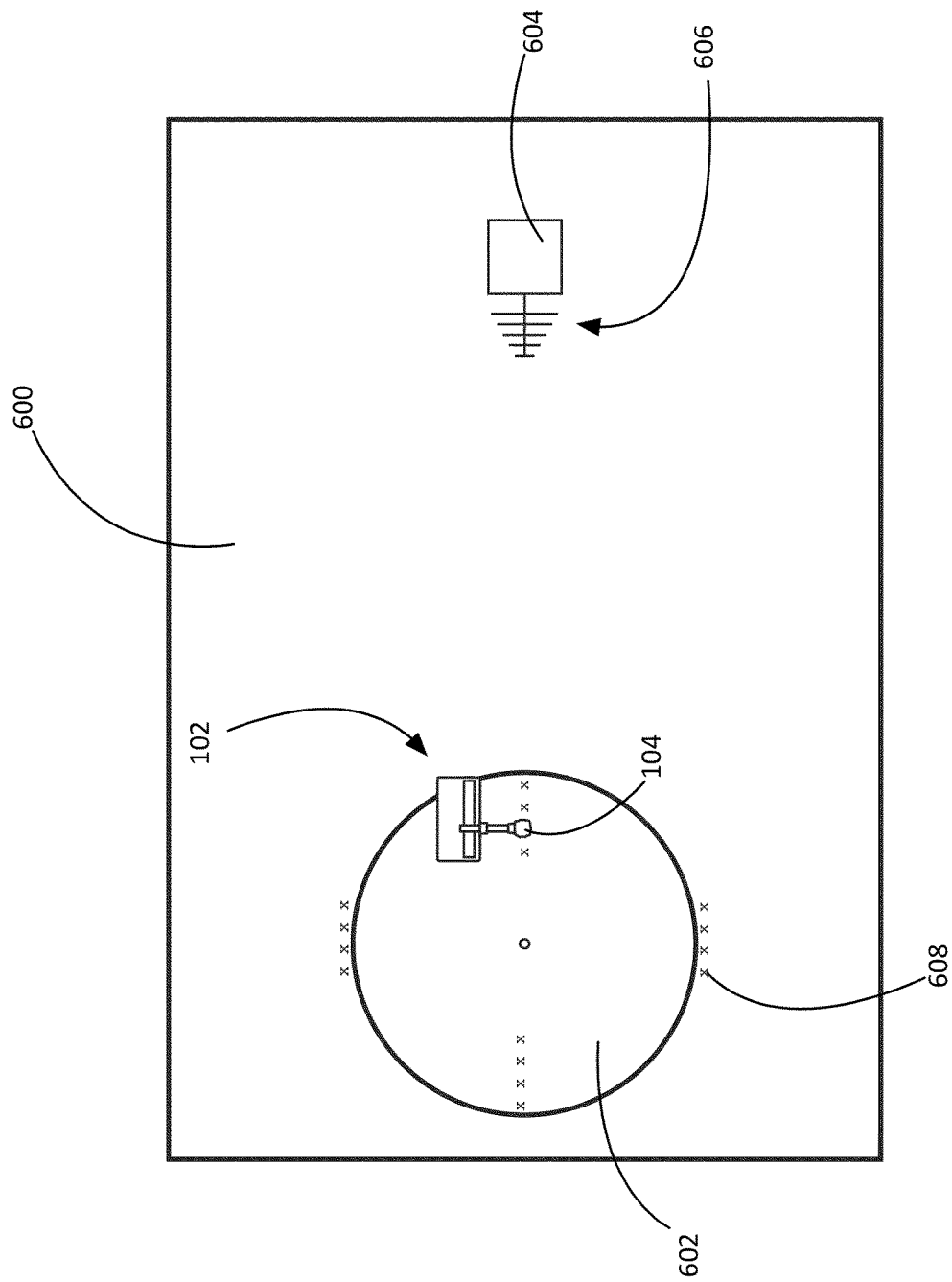
FIG. 6A is a schematic top view of a portable system taking frequency domain validation measurements of a semi-anechoic chamber.

In the context of a semi-anechoic chamber, during a conventional validation using measurements taken in the frequency domain (i.e., standing waves), the first direction 132 is towards and away from the receive mast, as shown in FIG. 6A. As is known in the art, that validation method requires measurements at discrete distances (e.g., at 0, then at 2 cm from 0, then at 10 cm, at 18 cm, at 30 cm, and at 40 cm), capturing phase data by physically changing the position of the antenna 104. According to various embodiments, the base 106 comprises a plurality of predefined sampling locations 140 along the first direction 132, spaced at specific intervals that satisfy the "standing wave protocol" of validation through the frequency domain. The sliding mount 108 is configured to slide between the sampling locations 140 and also configured to releasably couple to the base 106 at any of the sampling locations 140. One of the more tedious and error prone parts of the conventional validation procedure is moving the transmit mast 102 and then measuring the distance to the receive antenna to determine if the movement was sufficient. Advantageously, being able to temporarily lock down the sliding mount 108 at these sampling locations 140 means the distance does not need to be measured every time there is an incremental movement.

The sampling locations 140 and the way the sliding mount 108 releasably couples to them may be implemented through a variety of structures and mechanisms. Examples include, but are not limited to, bumps, protrusions, holes, clips, magnets, hooks, and the like. As a specific example, in one embodiment, the sampling locations 140 are holes 142 that match the size of one or more openings in the body of the sliding mount 108. The sliding mount 108 is configured to releasably couple to any of the holes 142 (i.e., sampling locations 140) through a fastener 144 placed inside a hole 142 of the base 106 and an opening of the sliding mount 108. In some embodiments, one or more fasteners 144 may be used to affix the sliding mount 108 directly to the base 106, while in other embodiments fasteners 144 may be used to block the path of the sliding mount 108 so it cannot move, without entering into the sliding mount 108.

In some embodiments, the transmit mast 102 may also include a horizontal crossbar 110. According to various embodiments, the deployed configuration 116 further comprises the horizontal crossbar 110 slidably coupled to the sliding mount 108 such that the horizontal crossbar 110 is slidable in a second direction 134. The second direction 134 is substantially, if not exactly, perpendicular to the first direction 132. In other words, in the context of FIGS. 1A-1D, the second direction 134 is side-to-side. The vertical support 112 is releasably coupled to the horizontal crossbar 110.

The horizontal crossbar 110 allows the separation between the vertical support 112 and the base 106 to be modified. This becomes very useful in the context of validation using measurements in the time domain, or cylindrical mode filtering (CMF). CMF takes measurements with the base 106 on the turntable, and the turntable rotating. The measurement point needs to be right at the boundary of the quiet zone, meaning it will be hanging out away from the footprint of the base 106 which cannot straddle the floor and the moving turntable.

In some embodiments, the bottom edge of the horizontal crossbar 110 is exactly 30 cm off of the floor. An industry standard says foam absorber on the floor that is taller than 30 centimeters is prohibited. The result is that the base 106 may be positioned in a pile of absorber materials while measurements are being taken.

In embodiments of the portable system 100 where the vertical support 112 is coupled to the sliding mount 108 through the horizontal crossbar 110, the end of the vertical support 112 that is in contact with or near the floor may be coupled to an end cap 128 that tapers to a tip 130. According to various embodiments, the measurement point of the antenna 104 is directly above the tip 130 of the end cap 128 in both polarities. In many conventional testing systems, the user has to estimate whether the measurement point is at the edge of quiet zone or not. Advantageous over those systems, the contemplated portable system 100 removes uncertainty regarding the location of the measurement point, allowing the user to be exact and adjust the portable system 100 to get the measurement point 402 right at the edge of the quiet zone (e.g., edge of turntable).

According to various embodiments, the contemplated portable system 100 may be designed for use with high frequencies. For example, in some embodiments, the transmit mast 102 may be RF transparent up to 40 GHz. Conventional transmit masts are typically designed to work to 6 GHz or 18 GHz.

The desired RF transparency may be achieved through choice of materials and/or structure. In some embodiments, some or all of the transmit mast 102 may comprise the thermoplastic 146 polycarbonate, which is relatively RF transparent to 40 gigahertz signals. In other embodiments, a different thermoplastic 146 may be used.

In one specific embodiment, some the connectors used to join polycarbonate components (e.g., the sleeve coupling the first segment 124 to the second segment 126, the interface between the horizontal crossbar 110 and the vertical support 112, the end cap 128, the antenna mount 114, etc.) may be 3D printed. The use of rapid fabrication technology like 3D printing is advantageous, as it allows for a bespoke fit. As an option, the 3D printer may use the polycarbonate blend PLA with a very low infill rate, essentially creating only a shell that is also essentially RF transparent up to 40 GHz. Other materials may also be used, though some may be limited to lower frequencies. For example, ABS may best be limited to 18 GHz.

Figure 2A:
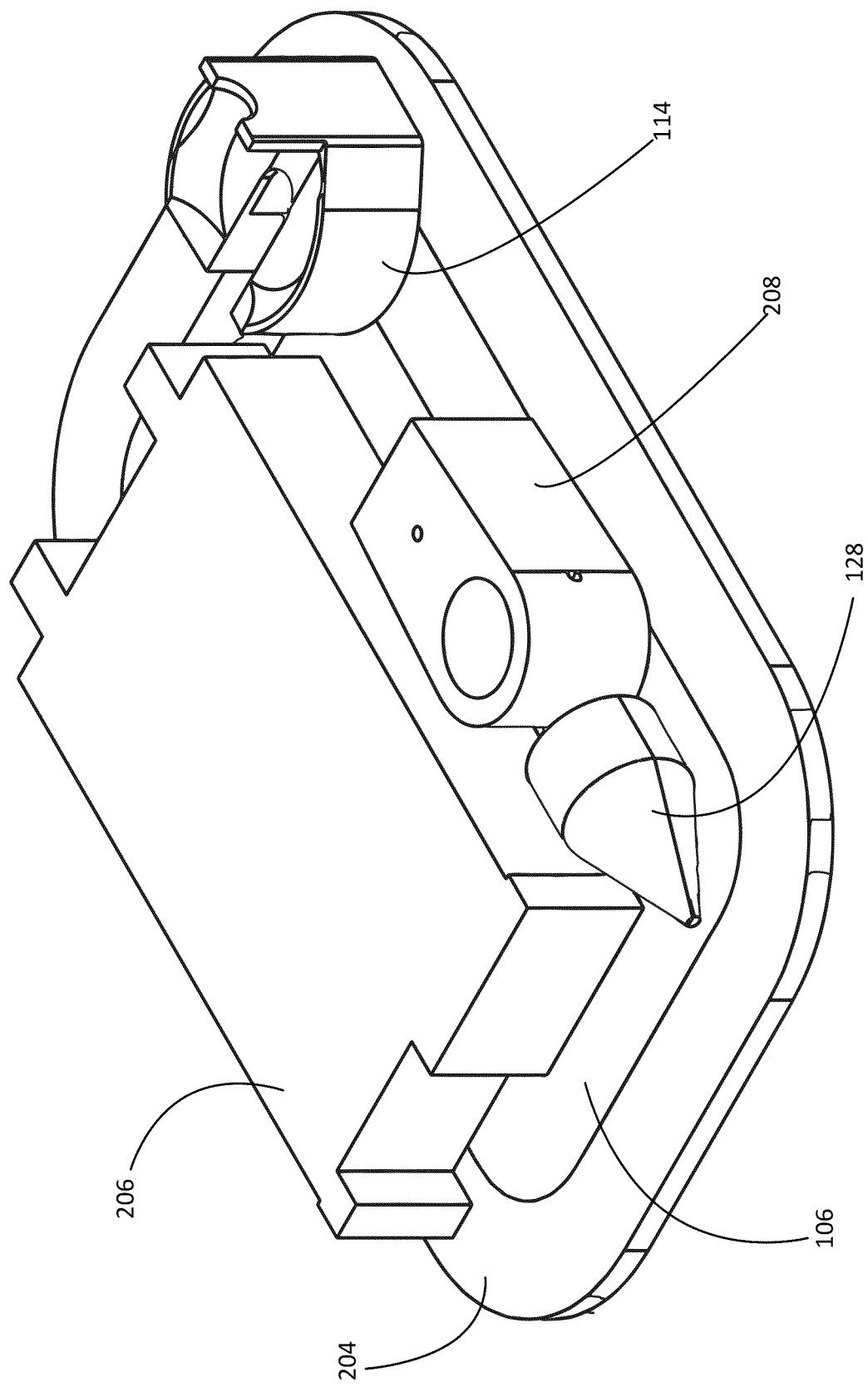
FIGS. 2A-2F are perspective views of various stages of a portable validation system being packed for travel with the transmit mast in the stowed configuration.
Figure 2B:
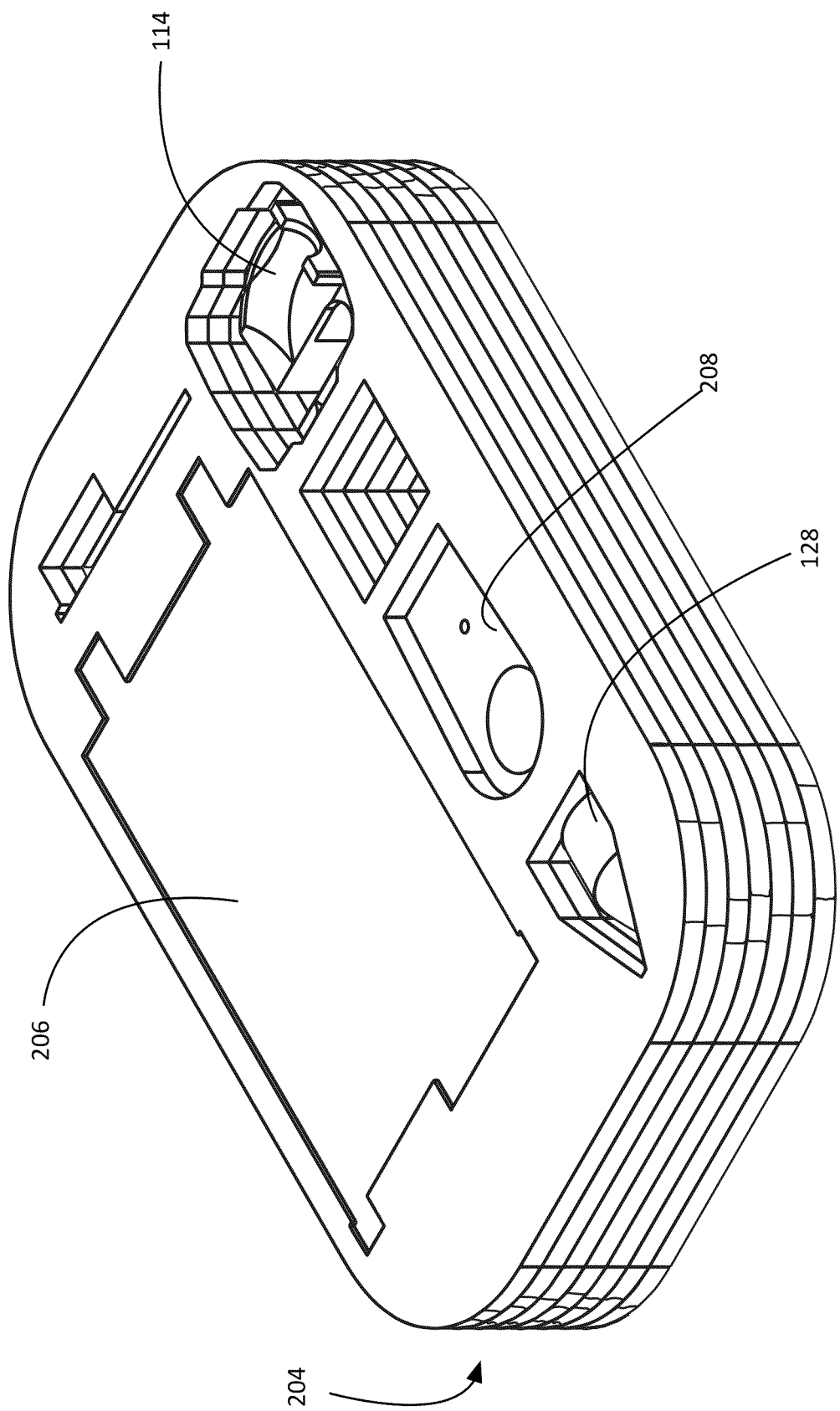
Figure 2C:
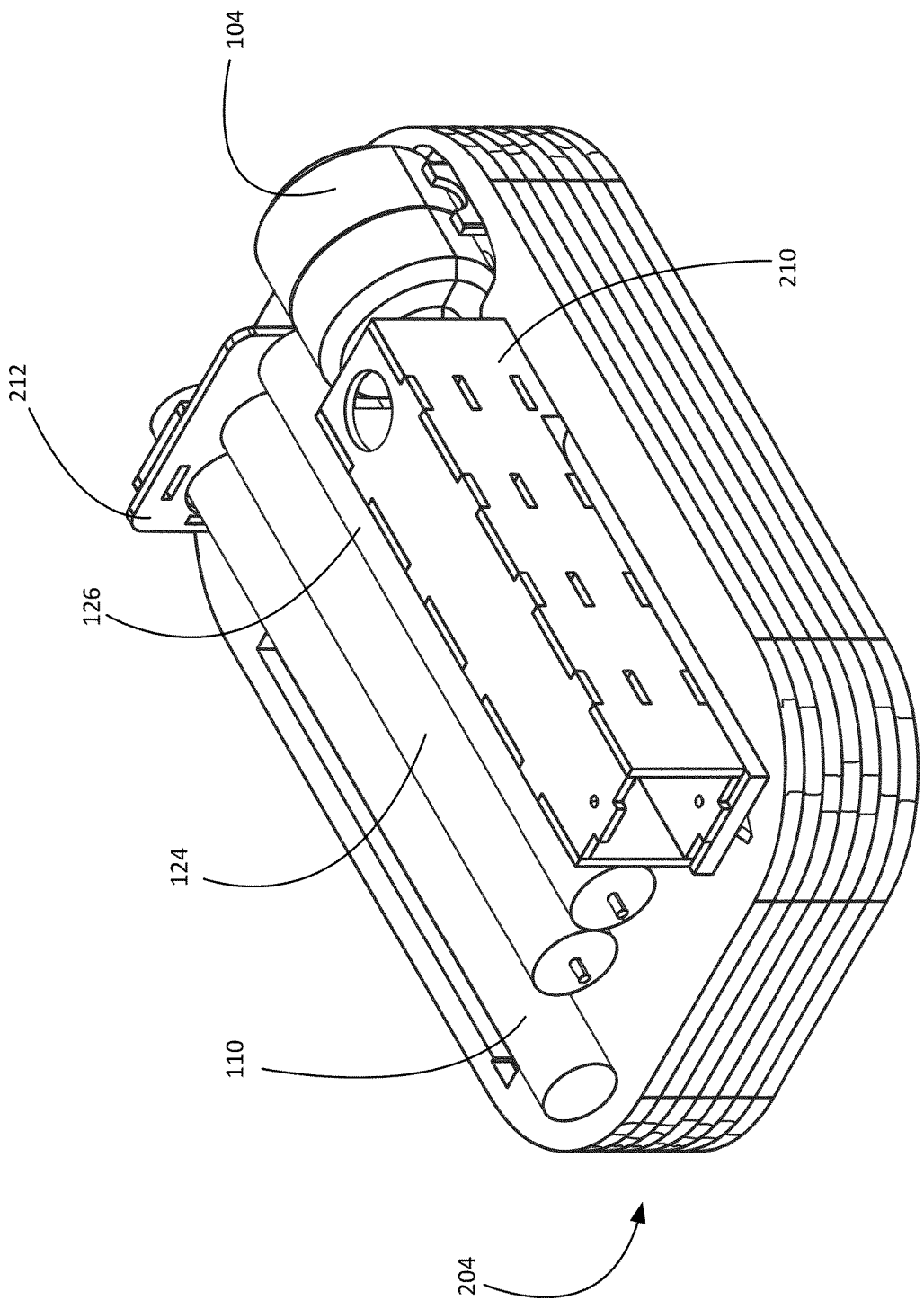
Figure 2D:
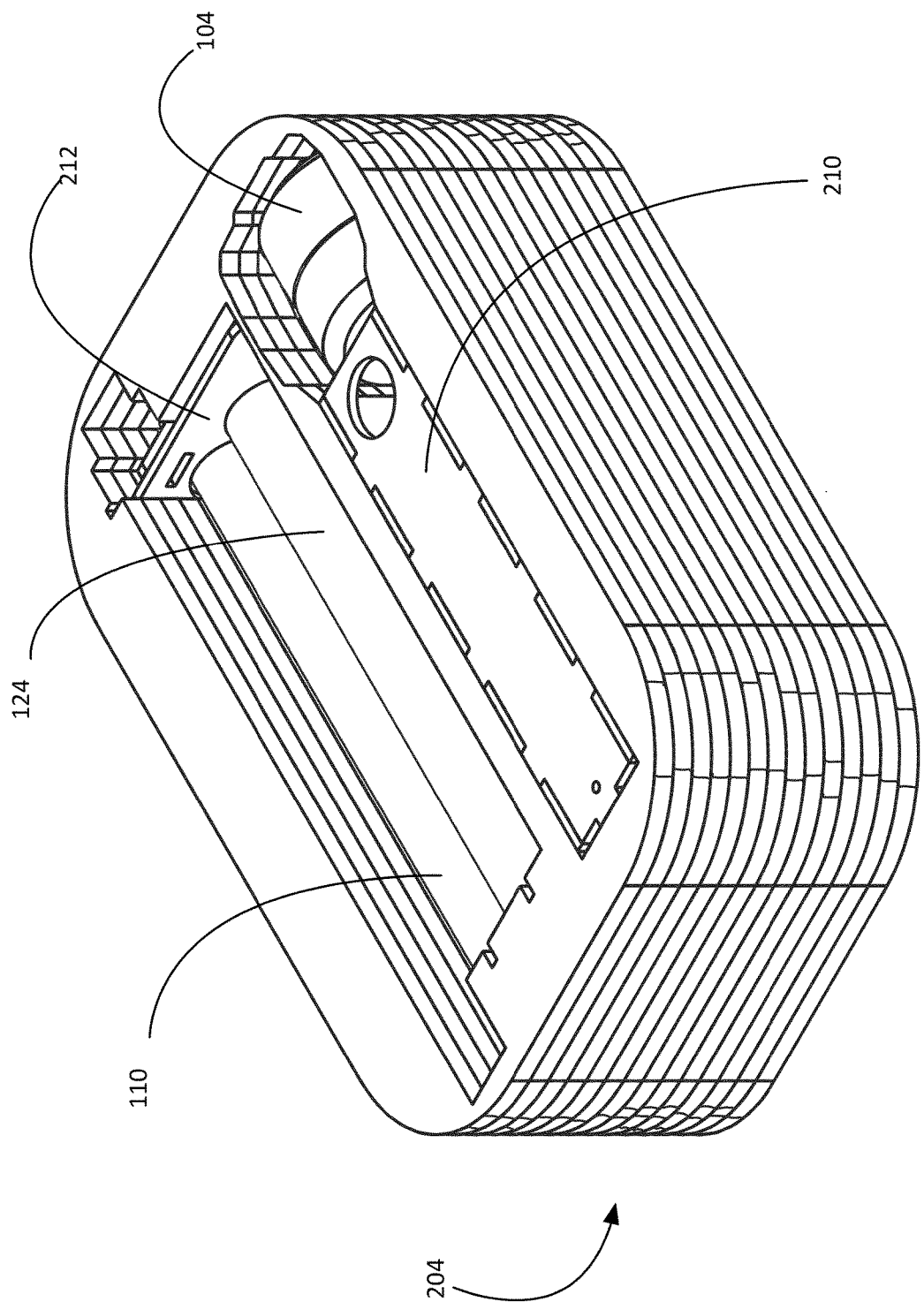
Figure 2E:
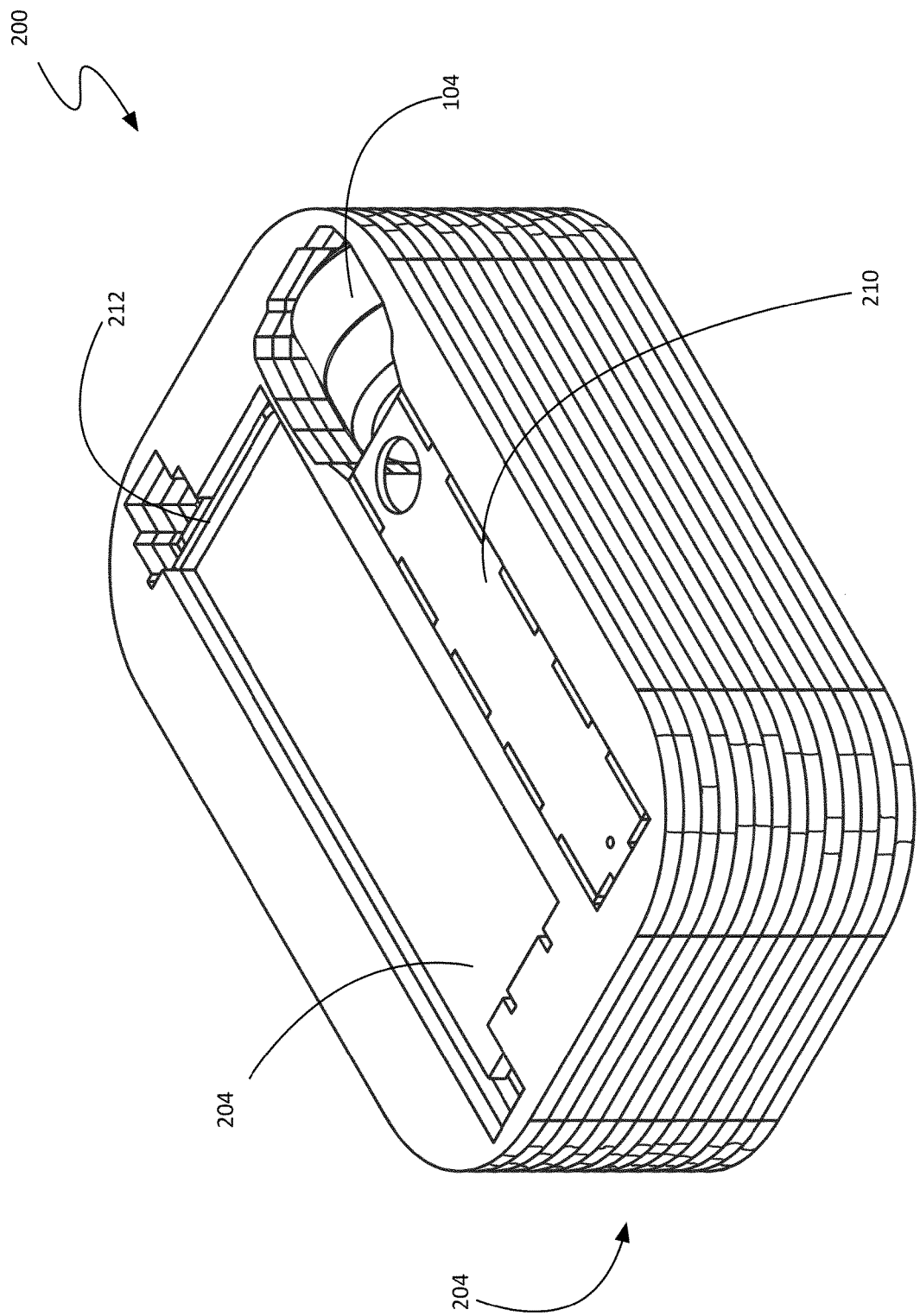
Figure 2F:
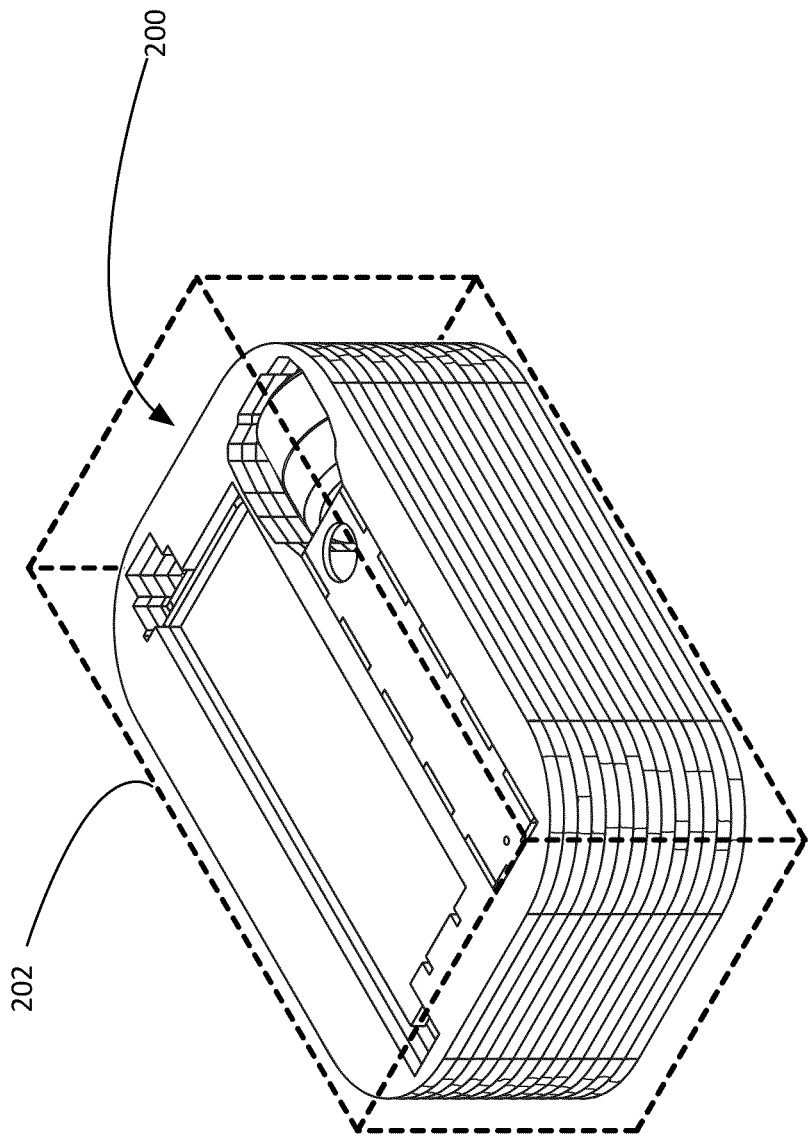

FIGS. 2A-2F are perspective views of a non-limiting example of a portable validation system 100 in various stages of being packed for travel, with FIGS. 2E and 2F showing the transmit mast 102 in the stowed configuration 200. According to various embodiments, the portable system 100 is sized and shaped such that when the transmit mast 102 is in the stowed configuration 200, the portable system 100 fits inside a carry-on luggage 202. The ability to take a validation system on an airplane as a carry-on item ensures it will not get delayed, damaged, or lost during shipment. Additionally, such a small form factor may be advantageous outside the context of travel, as it would be easy to store out of the way, yet easy to quickly retrieve.

Advantageous over traditional masts, the transmit mast 102 of the contemplated portable system 100 can easily be broken down into pieces. These pieces can fit together to form the stowed configuration 200, which takes up much less space. According to various embodiments, the portable system 100 comprises support material that is shaped to fit around the pieces of the disassembled transmit mast 102, holding them in the stowed configuration 200 and protecting them from impacts and shocks that can be expected to occur in transit. While the support material in the non-limiting example shown in FIGS. 2A-2F comprises shapes (e.g., panels, blocks, etc.) made of foam, other embodiments may use any other protective support material known in the art including, but not limited to, closed-cell foam, styrofoam, plastic formed to the shapes of the components, fabric and/or stuffing, and the like.

In some embodiments, the support material may comprise multiple types of materials. For example, in one embodiment, the support material may comprise an outer layer of foam that is lower density (i.e., the half-height crush weight is lower) for vibration dampening, and an inner layer of foam that is higher density which encases the actual parts that is more resistant to crushing/puncturing.

According to various embodiments, the contemplated portable system 100 may be disassembled and stored with the transmit mast 102 in the stowed configuration 200 by placing the various parts in foam panels 204 having cutouts sized and shaped to receive the parts. As the parts are stacked on top of each other, more panels are placed, permitting more stacking, until all the parts are secured in a stack of foam panels 204, as shown in FIG. 2E.

In some embodiments, including the non-limiting example shown in FIGS. 2A-2F, the arrangement of the various components of the transmit mast 102, when in the stowed configuration 200, will have a large volume that need to be filled with support material. According to some embodiments, these larger volumes may be filled with larger shapes, such as the foam block 206 shown in FIGS. 2A and 2B. As will be discussed later, in some embodiments these larger pieces of support material, or simply the void itself, may be used to store other objects related to the operation of the portable system 100.

In some embodiments, parts such as the horizontal crossbar 110, the vertical support 112, and/or the sliding mount 108 may be broken down further. For example, as shown, in some embodiments the horizontal crossbar 110 may comprise a vertical support receiver 208 that connects the horizontal crossbar 110 to the vertical support 112 when in the deployed configuration 116. In some embodiments, the sliding mount 108 can be broken down into a sliding mount riser 210 that holds the horizontal crossbar 110, and a sliding mount base 212 that is slidably coupled to the base 106 when the transmit mast 102 is in the deployed configuration 116. It should be noted that in other embodiments, various pieces of the transmit mast 102 may be broken down into smaller parts in different ways, with different partitioning.

FIGS. 2E and 2F show this non-limiting example of a portable system 100 with the transmit mast 102 in a stowed configuration 200. According to various embodiments, the stowed configuration 200 of the transmit mast 102 comprises the horizontal crossbar 110 and the vertical support 112 (in some embodiments, separable into a first segment 124 and a second segment 126) all being substantially parallel with the base 106 and with each other. For example, in the non-limiting example shown in FIGS. 2E and 2F, the horizontal crossbar 110, first segment 124, and second segment 126 are all substantially parallel with the base 106 and with each other. In the context of the present description and the claims that follow, a first object is "substantially parallel" with a second object when the long axis (i.e., the longest axis of elongation) of the first object is closer to parallel with the long axis of the second object than it is to perpendicular with it.

Looking to the non-limiting example shown in FIGS. 2A-2F, the first segment 124 is substantially parallel with the base 106 because the long axis of the first segment 124 (i.e., the central axis of this cylindrical first segment 124) is closer to parallel than perpendicular with the long axis of the base 106 (i.e., the longest side of this essentially rectangular base 106).

Furthermore, in some embodiments, the stowed configuration 200 further comprises at least one of the antenna mount 114 and the end cap 128 being separated from the vertical support 112. In other embodiments, one or both of these components may be integral with the vertical support 112, or a segment of the vertical support 112.

According to various embodiments, the geometry of the stowed configuration 200 of the transmit mast 102 may be such that the antenna 104 may be included without requiring much more space by fitting, at least partially, inside one or more pieces of the transmit mast 102. As shown, in some embodiments the storage material (e.g., foam panels 204, etc.) may be shaped (e.g., include cut-outs, etc.) such that the antenna 104 may be included and protected along with the transmit mast 102 during travel and/or storage. For example, as shown in FIG. 2C, in some embodiments the handle 118 of the antenna 104 may be placed inside one of the parts of the transmit mast 102 (e.g., the sliding mount riser 210, the horizontal crossbar 110, the vertical support 112, the first segment 124, the second segment 126, etc.).

Of course, in other embodiments the antenna 104 may be stored separately. While some embodiments of the contemplated portable system 100 may include an antenna 104 manufactured specifically for use with the contemplated transmit mast 102, in other embodiments the portable system 100 may be used in conjunction with other commercially available antennas, which may come with their own storage and/or travel solutions, or have differing needs regarding shielding from damage during travel (e.g., antennas may have varying degrees of fragility, etc.).

As previously mentioned, some embodiments of the contemplated portable system 100 may be able to be fit into a carry-on luggage 202 when the transmit mast 102 is in the stowed configuration 200. In the context of the present description and the claims that follow, a carry-on luggage 202 is any piece of luggage or a container that would be allowed on an airplane as a carry-on item. A common limitation for carry-on luggage 202 used by domestic airlines is an item that measures no greater than 22 inches by 14 inches by 9 inches. It should be noted that different airlines implement Federal rules in slightly different ways. Those skilled in the art will recognize that the contemplated system 100 may be adapted to conform with these and other variations.

Examples of carry-on luggage 202 include, but are not limited to, backpacks (e.g., Tortuga travel backpacks, etc.), cases, shells, and the like. In some embodiments, the carry-on luggage 202 may have a hard outer shell, while in others it may be soft. In some embodiments, the unused space within the carry-on luggage 202 may be filled with a protective material such as foam or other padding.

In some embodiments, including the non-limiting example shown in FIG. 2F, the carry-on luggage 202 may comprise the transmit mast 102 in the stowed configuration 200, and the antenna 104. In other embodiments, the carry-on luggage 202 may also contain one or more cables 138. Still other embodiments may also contain a vector network analyzer 136. As a specific example, in some embodiments, this additional equipment could be contained inside of, or in the place of, the foam block 206. In still other embodiments, the carry-on luggage 202 may contain, in addition to the transmit mast 102, antenna 104, vector network analyzer 136, and set of cables 138, a control computer (e.g., a laptop, a tablet device, etc.) with control software.

Figure 3:
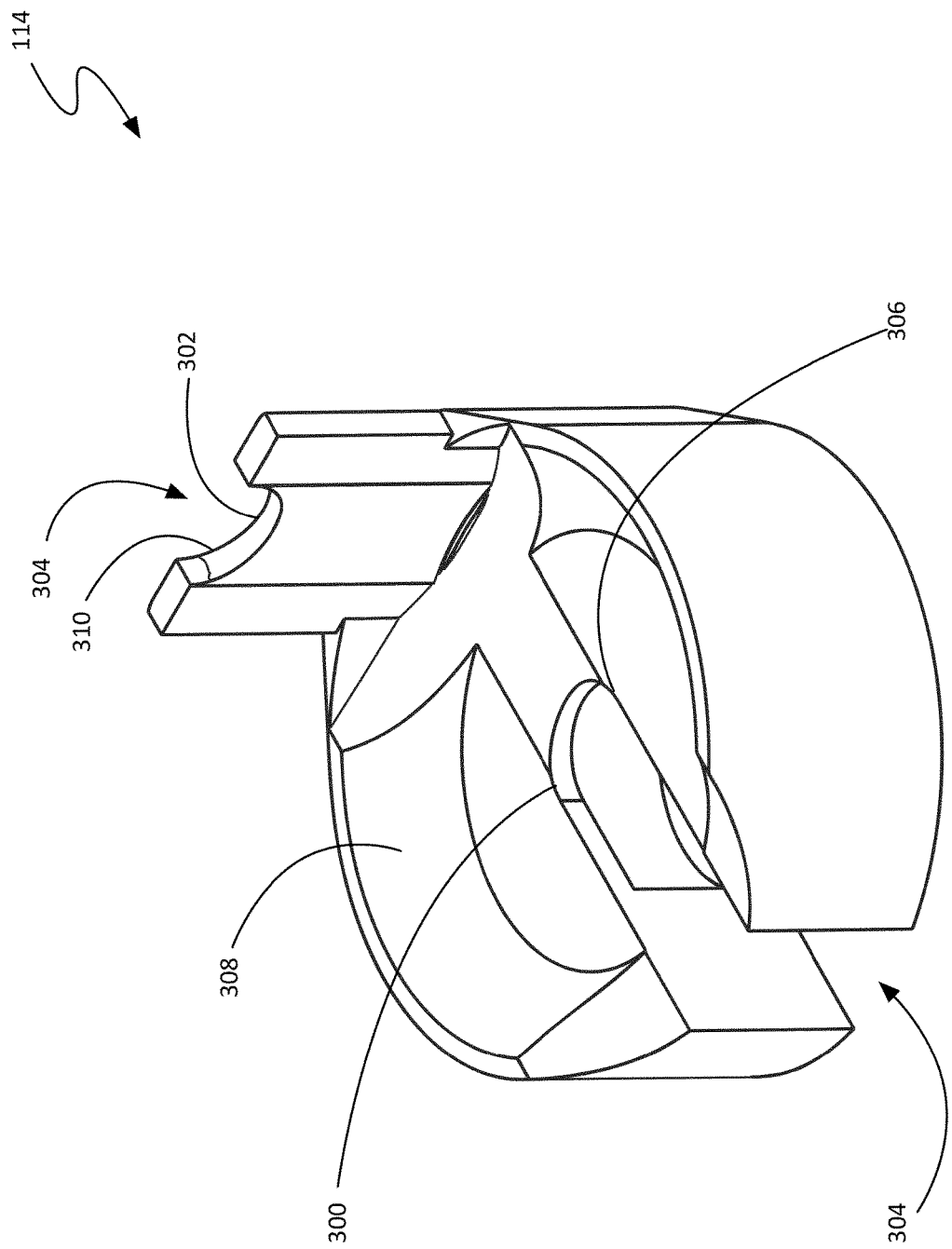
FIG. 3 is a perspective view of an antenna mount.

FIG. 3 is a perspective view of a non-limiting example of an antenna mount 114. According to various embodiments, the antenna mount 114 comprises a first antenna connector 300 configured to receive the antenna 104 and hold the antenna 104 in the vertical polarity or arrangement, and a second antenna connector 302 configured to receive the antenna 104 and hold the antenna 104 in the horizontal polarity or arrangement. In some embodiments, a single connector may be configured to hold the antenna 104 in either of the polarities.

In the context of the present description and the claims that follow, an antenna connector is part of the structure an antenna mount 114 that is configured to interface directly with part of the antenna 104. For example, in some embodiments the first antenna connector 300 and the second antenna connector 302 are each configured to receive the handle 118 of the antenna 104, and use the handle 118 to maintain the antenna 104 in the desired orientation or arrangement. As a specific example, as shown in FIG. 3, in some embodiments the first antenna connector 300 is an aperture 306 passing through the center of the antenna mount 114 and the second antenna connector 302 is a notch 310, with both the notch 310 and the aperture 306 sized to receive the handle 118 of the antenna 104.

In some embodiments, the first antenna connector 300 and the second antenna connector 302 may be the only interfaces between the antenna 104 and the antenna mount 114. In other embodiments, the antenna 104 may be in contact with other parts of the antenna 104, some of which may assist the connectors in holding the antenna 104 in a horizontal arrangement 404 or vertical arrangement 408 (see FIGS. 4A and 4B). For example, in some embodiments, the connectors may primarily serve to ensure the antenna 104 is pointed in the correct direction, and an interaction with a surface of the antenna mount 114 guides the antenna 104 precisely to the desired location.

In the specific, non-limiting example shown in FIG. 3, the top of the antenna mount 114 comprises an indentation 308 that is concave. The first antenna connector 300 of the antenna mount 114 is an aperture 306 passing through the indentation 308 and the second antenna connector 302 is a notch 310.

That indentation 308, and the housing 120 of the antenna 104, are both shaped such that the antenna 104 settles into the vertical arrangement 408 when the handle 118 of the antenna 104 is inside the aperture 306 and inside the vertical support 112 while the housing 120 sits in the indentation 308. Additionally, the antenna 104 settles into the horizontal arrangement 404 when the handle 118 is placed in the notch 310 while the housing 120 sits in the indentation 308. The complementary shapes of the indentation 308 and the housing 120 of the antenna 104 ensure the antenna 104 settles into the exact spot so the measurement point is in the same place for both connectors/arrangements/polarities. Although FIG. 3 shows that the indentation 308 may be rounded, or even a portion of a sphere, it should be noted that other complementary shapes exist. Some may be smooth, while others may have facets and edges. Some may have full contact between the housing 120 and the indentation 308 (i.e., the housing 120 and the indentation 308 are opposites). Others may have minimal contact between the housing 120 and the indentation 308.

As a specific example, in one embodiment the indentation 308 is faceted and concave. The housing 120 is shaped such that it contacts one or more facets at a single point each, sliding downward. As the antenna 104 gets closer to its destination, it comes into contact with a growing number of facets but only in contact with each one at a single point. The sliding continues until the collection of point contacts leave the housing 120 with nowhere else to go, resulting in the antenna 104 settling into one of the polarity arrangements that will be discussed in the context of FIGS. 4A and 4B.

The advantage of configuring the antenna 104 and antenna mount 114 to self-position into the desired arrangements with the measurement point held fixed in space is that it encourages consistency. The measurements will get the same results every time, independent of who is performing the test. Additionally, by maintaining the position of the measurement point of the antenna 104 in both polarities, the height of the transmit mast 102 won't need to be adjusted when moving between the two polarities for validation measurements.

In some embodiments, the transmit mast 102, in particular the antenna mount 114, may be designed such that the antenna 104 may be moved between the horizontal arrangement 404 and the vertical arrangement 408 without requiring the antenna 104 to be unplugged from the cable 138 through which it is communicatively coupled to a device used for testing (e.g., vector network analyzer 136, etc.), further expediting the transition between antenna arrangements. According to various embodiments, this is made possible by voids 304. In the context of the present description and the claims that follow, a void 304 is an empty space in an antenna connector that is sized to admit at least the cable 138 into the portion of the antenna connector that will ultimately contain a part of the antenna 104 (e.g., the handle 118 of the antenna 104, etc.). For example, if the first antenna connector 300 of the antenna mount 114 shown in FIG. 3 did not have a void 304, the annular shape would require the cable 138 to be disconnected to be fed through the aperture 306 to be reconnected to the handle 118 after the antenna 104 had settled into the indentation 308 and the handle 118 was inside the aperture 306. According to various embodiments, both the first antenna connector 300 and the second antenna connector 302 each comprise at least one void 304.

In some embodiments, a void 304 may operate in conjunction with another component of the transmit mast 102. For example, in some embodiments where the vertical support 112 has a longitudinal opening 122, the deployed configuration 116 may further comprise the antenna mount 114 being oriented with respect to the vertical support 112 such that the void 304 of the first antenna connector 300 is aligned with the longitudinal opening 122 of the vertical support 112, allowing the handle 118 (or at the very least, the cable 138) to pass through.

Figure 4A:
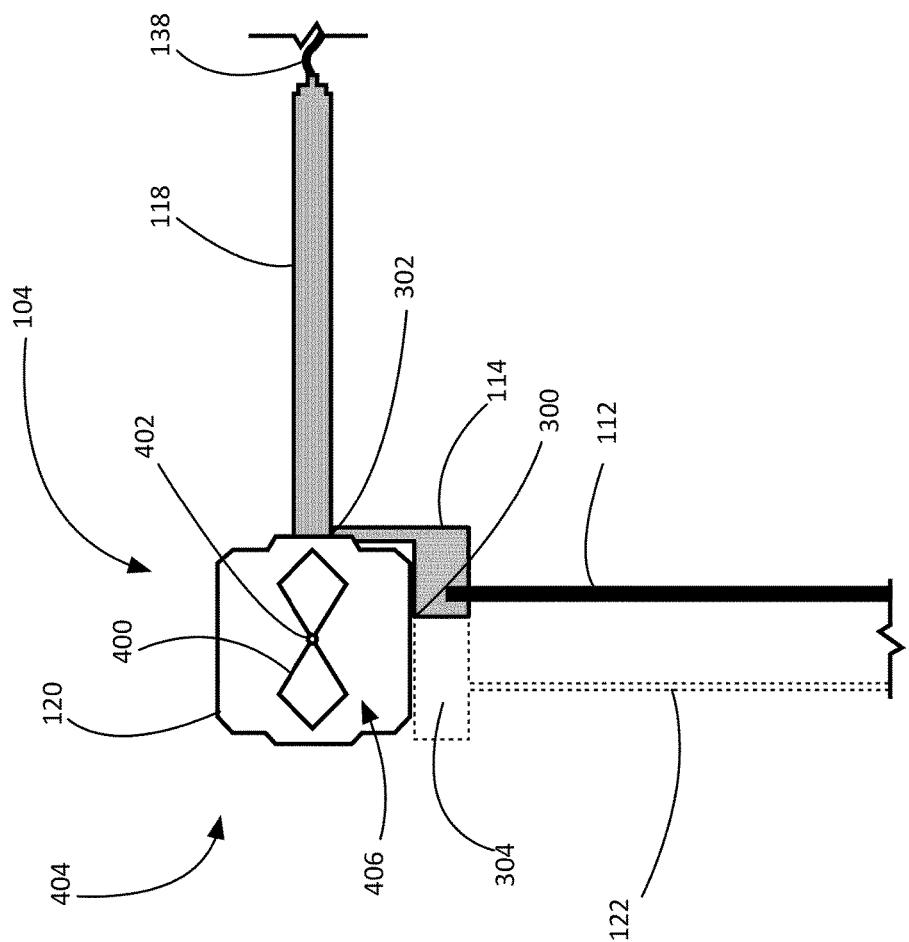
FIGS. 4A and 4B are cross-sectional views of an antenna mount and an antenna in horizontal and vertical arrangements, respectively.
Figure 4B:
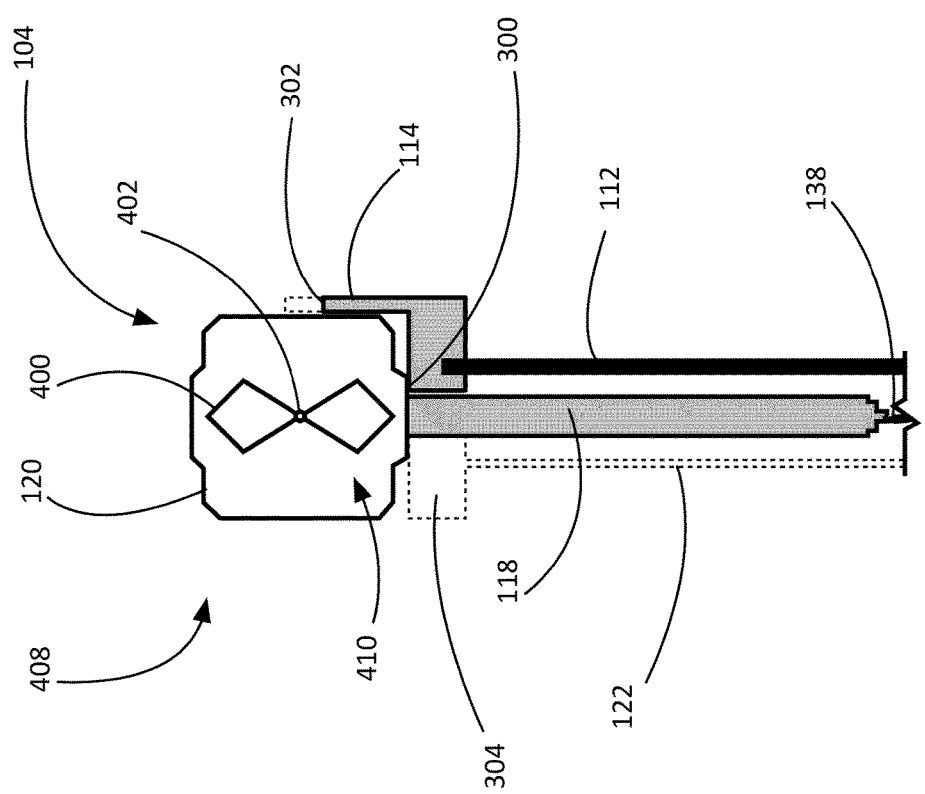

FIGS. 4A and 4B are cross-sectional views along line A-A of a non-limiting example of an antenna mount 114 and an antenna 104 in the horizontal arrangement 404 and the vertical arrangement 408 respectively. As shown, the antenna 104 comprises a radiative element 400 having a measurement point 402, as is known in the art, with the radiative element 400 positioned inside the housing 120. In the context of the present description and the claims that follow, the vertical arrangement 408 of the antenna 104 is defined as the radiative element 400 being oriented to have a vertical polarity 410, and the horizontal arrangement 404 of the antenna 104 is defined as the radiative element 400 being oriented to have a horizontal polarity 406. As previously discussed, the antenna mount 114 is configured to hold the antenna 104 such that the measurement point 402 of the radiative element 400 is at the same location relative to the transmit mast 102 for both the vertical arrangement 408 and the horizontal arrangement 404 of the antenna 104.

Figure 5:
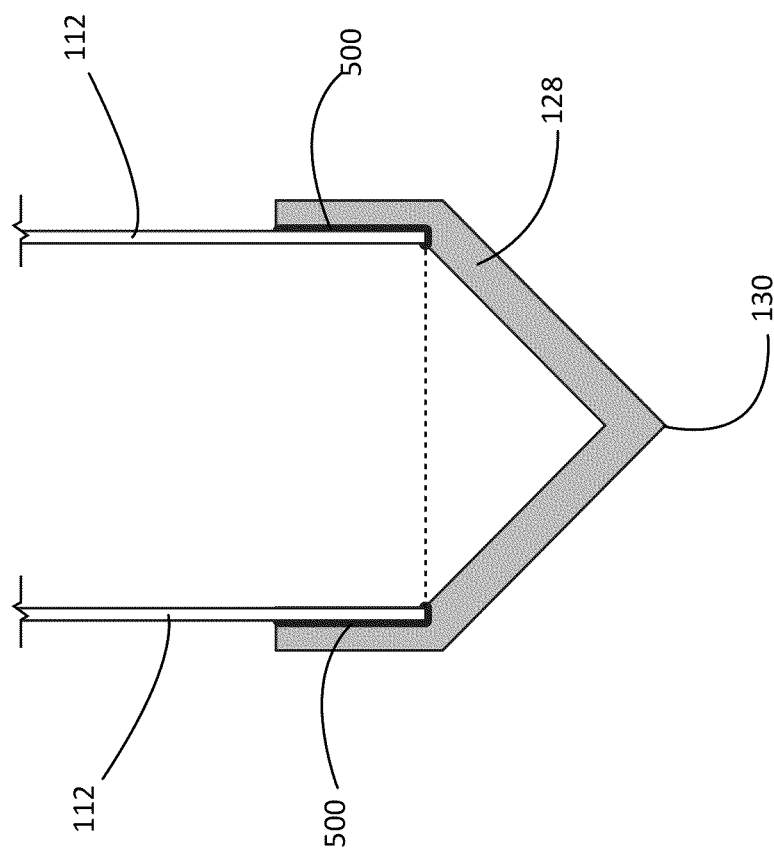
FIG. 5 is a cross-sectional view of an end cap coupled to a vertical support.

FIG. 5 is a cross-sectional view along line A-A of a non-limiting example of an end cap 128 coupled to a vertical support 112. According to various embodiments, the transmit mast 102 comprises an end cap 128 that tapers to a tip 130. The end cap 128 is coupled to the bottom end of the vertical support 112, opposite the antenna mount 114. As previously mentioned, in both the vertical arrangement 408 and the horizontal arrangement 404 of the antenna 104, the measurement point 402 of the radiative element 400 is fixed in space and directly above the tip 130 of the end cap 128. When using conventional testing systems, one typically has to estimate if the measurement point 402 is at the edge of quiet zone. Having the tip 130 directly beneath the measurement point 402 removes the guesswork and allows the user to be exact and get the measurement point 402 right at the edge of the quiet zone (e.g., edge of the turntable).

While the contemplated portable system 100 can be used to perform the conventional frequency domain tests (and perform them better than the conventional systems), the portable system 100 is able to perform measurements in the time domain that would not be possible using other validation systems. As will be discussed in the context of FIG. 6B, below, CMF measurements are taken by placing the base 106 near the edge of the turntable so the tip 130 is touching the floor of the semi-anechoic chamber right at the edge of the quiet zone. The turntable rotates, dragging the tip 130 on the stationary floor. All 360 degrees are examined, with measurements taken every few degrees. This stop-and-go movements, along with vibrations translated from the end cap 128 to the antenna 104 via the vertical support 112, can result in a shaking antenna 104. This could introduce non-negligible error to the measurements, or at the very least slow down the measurement process as each reading would require waiting for the antenna 104 to stop shaking.

In some embodiments, the transmit mast 102 may further comprise vibration dampening material 500 coupled to one of the vertical support 112 and the end cap 128 such that the deployed configuration 116 further comprises the end cap 128 coupled to the vertical support 112 with the vibration dampening material 500 between the end cap 128 and the vertical support 112. The vibration dampening material 500 dampens the vibration of the moving turntable, so the antenna 104 doesn't shake as it moves. Examples of vibration dampening material 500 include, but are not limited to, foam and an elastomer.

FIG. 6A is a schematic top view of a non-limiting example of a portable system 100 taking frequency domain validation measurements of a semi-anechoic chamber 600. As is known in the art, conventional frequency domain validation methods include placing the transmit mast 102 at a limited number of locations on the turntable 602. As a specific example, if the direction toward the receive antenna 606 on the receive mast 604 is 'north', then the transmit mast 102 is moved to north, east, west and in the center of the turntable 602. At each of these locations, measurements are taken at a set of collection points 608 spaced apart to probe potential standing waves. This is defining an area of uniform RF response, where reflections don't cause problems, called the quiet zone. This zone is described as a cylinder, but a cylinder defined by three points. The ratio between the three outer points yields the test result; if the ratio is less than a certain threshold (e.g., 4), the semi-anechoic chamber passes.

There are a number of downsides to this traditional test, the largest being the lack of accuracy due to defining the cylinder using only three points. Additionally, this method requires numerous measurements, with adjustments needed after each measurement. The contemplated portable system 100 helps speed up the process by sliding the sliding mount 108 between the sampling locations 140 to quickly move the antenna 104 to the next collection point 608 without requiring another distance measurement between antennas 104.

Figure 6B:
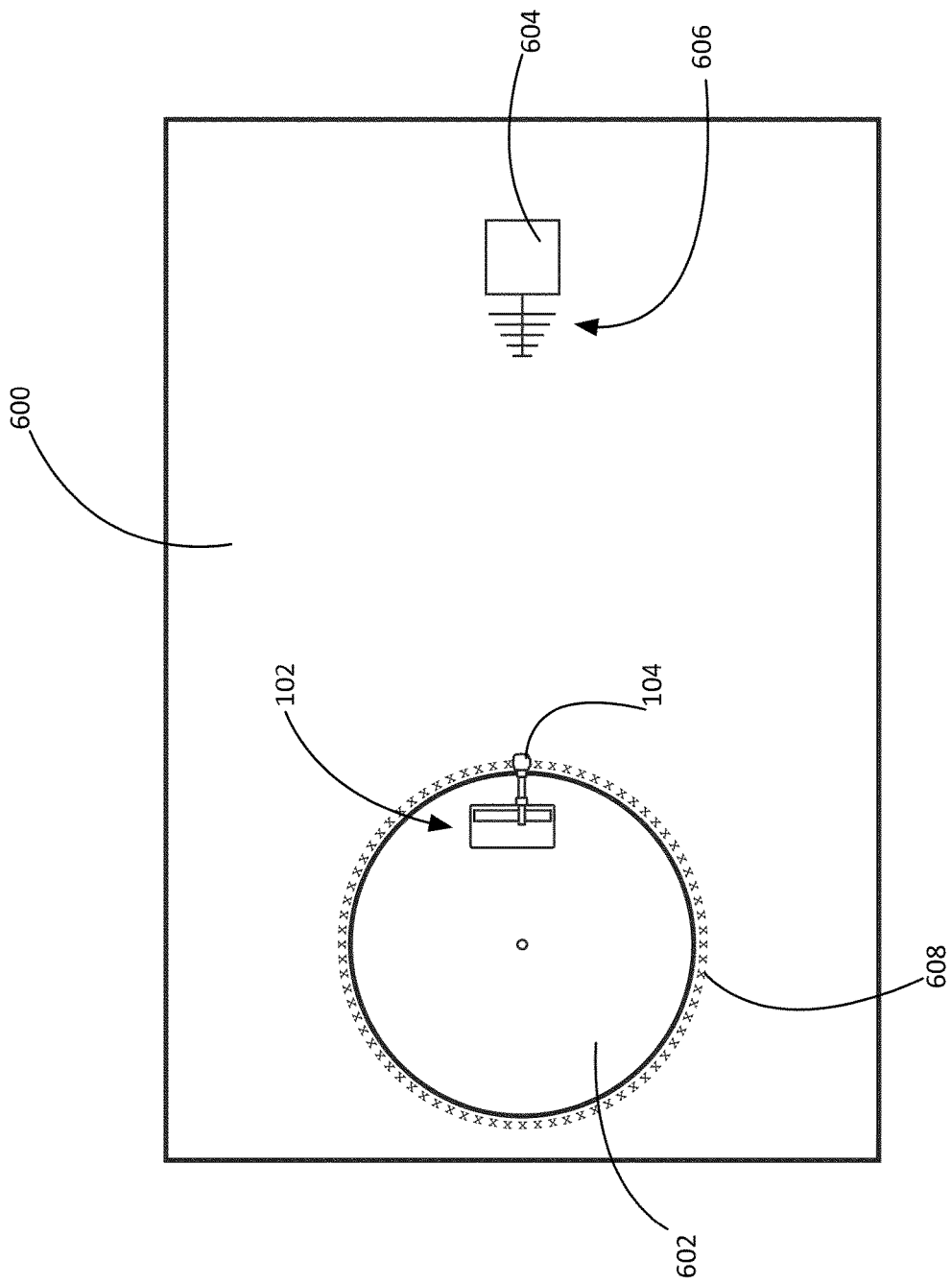
FIG. 6B is a schematic top view of a portable system taking time domain validation measurements of a semi-anechoic chamber.

FIG. 6B is a schematic top view of a non-limiting example of a portable system 100 taking time domain validation measurements of a semi-anechoic chamber 600. CMF measurements are taken by placing the base 106 near the edge of the turntable 602 so the tip 130 of the end cap 128 is touching the floor of the semi-anechoic chamber 600 right at the edge of the quiet zone. The turntable 602 rotates, dragging the tip 130 on the stationary floor as measurements are taken. All 360 degrees are examined, with measurements collecting magnitude and phase every few degrees. A mathematical translation is used to translate all of those collection points 608 and their measurements back to the center, where a ratio is defined.

Cylindrical mode filtering presents a number of advantages over conventional validation methods. Rather than relying on three points to define the quiet zone, CMF uses 360 degrees. CMF also tends to be much faster. The standard method takes about a day, if everything is working right. In contrast, CMF takes about an hour. The results from CMF are also higher quality than those of the standard method, because measurements are taken every degree or every half degree, versus only measuring three points in a plane in space.

Conventional masts cannot be used for CMF because their antenna sticks out over the base. So, if the base is both on the turntable 602 and off the turntable 602, rotating the turntable 602 will disrupt the transmit mast. On the other hand, in the contemplated portable system 100, the base 106 is separated from the horizontal crossbar 110 with a 30 centimeter height, and can extend outward. This means the base 106 can sit on the turntable 602 while the antenna 104 is right at the edge, as indicated by the tip 130 of the end cap 128.

Where the above examples, embodiments and implementations reference examples, it should be understood by those of ordinary skill in the art that other portable systems for the validation of a semi-anechoic chamber could be intermixed or substituted with those provided. In places where the description above refers to particular embodiments of a portable system for the validation of a semi-anechoic chamber, it should be readily apparent that a number of modifications may be made without departing from the spirit thereof and that these embodiments and implementations may be applied to other validation and characterization technologies as well. Accordingly, the disclosed subject matter is intended to embrace all such alterations, modifications and variations that fall within the spirit and scope of the disclosure and the knowledge of one of ordinary skill in the art.

The invention claimed is:

1. A portable system for the validation of a semi-anechoic chamber, comprising:
   an antenna comprising a radiative element having a measurement point;
   a transmit mast having a deployed configuration and a stowed configuration, the transmit mast comprising:
      a base;
      a vertical support; and
      an antenna mount configured to hold the antenna in a vertical arrangement and a horizontal arrangement while the transmit mast is in the deployed configuration, with the vertical arrangement of the antenna comprising the radiative element being oriented to have a vertical polarity, and with the horizontal arrangement of the antenna comprising the radiative element being oriented to have a horizontal polarity;
   wherein the deployed configuration comprises:
      the vertical support releasably coupled to the base;
      the antenna mount coupled to the vertical support, opposite the base; and
      the antenna mount holding the antenna in one of the vertical arrangement and the horizontal arrangement while the antenna is communicatively coupled to a cable;
   wherein the stowed configuration comprises the vertical support being substantially parallel with the base;
   wherein the antenna mount is further configured to hold the antenna such that the measurement point of the radiative element is at the same location relative to the transmit mast for both the vertical arrangement and the horizontal arrangement of the antenna;
   wherein the portable system is sized such that when the transmit mast is in the stowed configuration, the portable system fits inside a carry-on luggage.

2. The portable system of claim 1, wherein the antenna mount comprises a first antenna connector configured to receive the antenna and hold the antenna in the vertical arrangement, and a second antenna connector configured to receive the antenna and hold the antenna in the horizontal arrangement.

3. The portable system of claim 1:
   wherein the vertical support comprises a first segment and a second segment;
   wherein the deployed configuration further comprises:
      the first segment of the vertical support releasably coupled to the second segment of the vertical support;
      the second segment of the vertical support releasably coupled to the base; and
      the antenna mount coupled to the first segment of vertical support, opposite the second segment;
   wherein the stowed configuration comprises a horizontal crossbar, the first segment, and the second segment all being substantially parallel with the base and with each other.

4. The portable system of claim 1, further comprising a vector network analyzer, wherein the deployed configuration of the transmit mast further comprises the antenna mount holding the antenna in one of the vertical arrangement and the horizontal arrangement while the antenna is communicatively coupled to the vector network analyzer through the cable.

5. The portable system of claim 1, wherein the carry-on luggage measures no more than 22 inches by 14 inches by 9 inches.

6. The portable system of claim 1, wherein the transmit mast is RF transparent up to 40 GHz.

7. The portable system of claim 1, wherein the transmit mast is composed of a thermoplastic.

8. A portable system for the validation of a semi-anechoic chamber, comprising:
   an antenna comprising a radiative element having a measurement point;
   a transmit mast having a deployed configuration and a stowed configuration, the transmit mast comprising:
      a base;
      a vertical support; and
      an antenna mount configured to hold the antenna in a vertical arrangement and a horizontal arrangement while the transmit mast is in the deployed configuration, with the vertical arrangement of the antenna comprising the radiative element being oriented to have a vertical polarity, and with the horizontal arrangement of the antenna comprising the radiative element being oriented to have a horizontal polarity;
   wherein the deployed configuration comprises:
      the vertical support releasably coupled to the base;
      the antenna mount coupled to the vertical support, opposite the base; and
      the antenna mount holding the antenna in one of the vertical arrangement and the horizontal arrangement while the antenna is communicatively coupled to a cable;
   wherein the stowed configuration comprises the vertical support being substantially parallel with the base;
   wherein the antenna mount is further configured to hold the antenna such that the measurement point of the radiative element is at the same location relative to the transmit mast for both the vertical arrangement and the horizontal arrangement of the antenna;
   wherein the portable system is sized such that when the transmit mast is in the stowed configuration, the portable system fits inside a carry-on luggage;
   wherein the antenna mount comprises a first antenna connector configured to receive the antenna and hold the antenna in the vertical arrangement, and a second antenna connector configured to receive the antenna and hold the antenna in the horizontal arrangement;
   wherein the antenna further comprises a handle and a housing, with the radiative element positioned inside the housing and the handle extending away from the housing, the antenna configured to communicatively couple with the cable through the handle; and
   wherein the first antenna connector and the second antenna connector are each configured to receive the handle of the antenna.

9. The portable system of claim 8:
   wherein the vertical support is hollow and comprises a longitudinal opening sized to admit the handle;
   wherein both the first antenna connector and the second antenna connector each comprise a void;
   wherein the deployed configuration further comprises the antenna mount being oriented with respect to the vertical support such that the void of the first antenna connector is aligned with the longitudinal opening of the vertical support; and
   wherein each void is sized to admit the handle of the antenna such that the cable can remain coupled to the handle of the antenna as the antenna is moved between the vertical arrangement and the horizontal arrangement while the transmit mast is in the deployed configuration.

10. The portable system of claim 8:
    wherein the antenna mount comprises an indentation that is concave;
    wherein the first antenna connector of the antenna mount is an aperture passing through the indentation and the second antenna connector of the antenna mount is a notch, the notch and aperture both sized to receive the handle of the antenna; and
    wherein the housing of the antenna and the indentation of the antenna mount are each shaped such that the antenna settles into the vertical arrangement when the handle of the antenna is inside the aperture of the antenna mount and inside the vertical support while the housing sits in the indentation, and the antenna settles into the horizontal arrangement when the handle is placed in the notch of the antenna mount while the housing sits in the indentation.

11. The portable system of claim 8, wherein the stowed configuration further comprises at least a portion of the antenna positioned inside the transmit mast.

12. The portable system of claim 11, wherein the portion of the antenna positioned inside the transmit mast is the handle of the antenna.

13. A portable system for the validation of a semi-anechoic chamber, comprising:
    an antenna comprising a radiative element having a measurement point;
    a transmit mast having a deployed configuration and a stowed configuration, the transmit mast comprising:
       a base;
       a vertical support; and
       an antenna mount configured to hold the antenna in a vertical arrangement and a horizontal arrangement while the transmit mast is in the deployed configuration, with the vertical arrangement of the antenna comprising the radiative element being oriented to have a vertical polarity, and with the horizontal arrangement of the antenna comprising the radiative element being oriented to have a horizontal polarity;
    wherein the deployed configuration comprises:
       the vertical support releasably coupled to the base;
       the antenna mount coupled to the vertical support, opposite the base; and
       the antenna mount holding the antenna in one of the vertical arrangement and the horizontal arrangement while the antenna is communicatively coupled to a cable;
    wherein the stowed configuration comprises the vertical support being substantially parallel with the base;
    wherein the antenna mount is further configured to hold the antenna such that the measurement point of the radiative element is at the same location relative to the transmit mast for both the vertical arrangement and the horizontal arrangement of the antenna;
    wherein the portable system is sized such that when the transmit mast is in the stowed configuration, the portable system fits inside a carry-on luggage;

wherein the transmit mast further comprises a sliding mount;

wherein the deployed configuration of the transmit mast further comprises the sliding mount slidably coupled to the base such that the sliding mount is slidable along a first direction; and wherein the base comprises a plurality of predefined sampling locations along the first direction, and wherein the sliding mount is configured to slide between all sampling locations and also configured to releasably couple to the base at any of the sampling locations.

14. The portable system of claim 13, wherein the sampling locations are holes, and wherein the sliding mount is configured to releasably couple to any sampling location through a fastener.

15. The portable system of claim 13:

wherein the transmit mast further comprises a horizontal crossbar;

wherein the deployed configuration further comprises:
the horizontal crossbar slidably coupled to the sliding mount such that the horizontal crossbar is slidable in a second direction that is substantially perpendicular to the first direction; and
the vertical support releasably coupled to the horizontal crossbar;

wherein the stowed configuration comprises the horizontal crossbar and the vertical support being substantially parallel with the base and with each other.

16. The portable system of claim 15:

wherein the transmit mast further comprises:
an end cap that tapers to a tip; and
a vibration dampening material coupled to one of the vertical support and the end cap;

wherein the deployed configuration further comprises the end cap coupled to the vertical support opposite the antenna mount, with the vibration dampening material between the end cap and the vertical support; and wherein, for both the vertical arrangement and the horizontal arrangement of the antenna, the measurement point of the radiative element is directly above the tip of the end cap.

17. The portable system of claim 16, wherein the stowed configuration further comprises at least one of the antenna mount and the end cap being separated from the vertical support.

18. The portable system of claim 15, further comprising a vertical support receiver, wherein the deployed configuration further comprises the vertical support receiver coupled to the horizontal crossbar and slidably coupled to the vertical support.

19. The portable system of claim 15, wherein the sliding mount comprises a sliding mount riser and a sliding mount base, and wherein the deployed configuration further comprises the horizontal crossbar slidably coupled to the sliding mount riser, the sliding mount base slidably coupled to the base, and the sliding mount riser coupled to the sliding mount base.

* * * * *